(12) United States Patent
Sugizaki et al.

(10) Patent No.: US 8,957,434 B2
(45) Date of Patent: Feb. 17, 2015

(54) LIGHT EMITTING DEVICE, LIGHT EMITTING MODULE, AND METHOD FOR MANUFACTURING LIGHT EMITTING DEVICE

(71) Applicant: Kabushiki Kaisha Toshiba, Minato-ku (JP)

(72) Inventors: Yoshiaki Sugizaki, Kanagawa-ken (JP); Akihiro Kojima, Kanagawa-ken (JP); Yosuke Akimoto, Kanagawa-ken (JP); Hidefumi Yasuda, Kanagawa-ken (JP); Nozomu Takahashi, Kanagawa-ken (JP); Kazuhito Higuchi, Kanagawa-ken (JP); Susumu Obata, Kanagawa-ken (JP); Hideo Tamura, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/940,754

(22) Filed: Jul. 12, 2013

(65) Prior Publication Data

US 2013/0299864 A1 Nov. 14, 2013

Related U.S. Application Data

(63) Continuation of application No. PCT/JP2011/004534, filed on Aug. 10, 2011.

(30) Foreign Application Priority Data

Jan. 14, 2011 (JP) ................................ 2011-005625

(51) Int. Cl.
*H01L 33/00* (2010.01)
*H01L 33/36* (2010.01)
(Continued)

(52) U.S. Cl.
CPC ................ *H01L 33/36* (2013.01); *H01L 21/28* (2013.01); *H01L 33/486* (2013.01); *H01L 33/62* (2013.01);
(Continued)

(58) Field of Classification Search
CPC ......... H01L 33/36; H01L 21/28; H01L 33/50; H01L 33/486; H01L 33/62
USPC ........................................................... 257/98
See application file for complete search history.

(56) References Cited

U.S. PATENT DOCUMENTS 7,554,126 B2 6/2009 Higashi et al.
7,847,306 B2 12/2010 Feng et al.
(Continued)

FOREIGN PATENT DOCUMENTS

JP 10-163536 6/1998
JP 2000-244012 9/2000
(Continued)

OTHER PUBLICATIONS

International Search Report issued on Jan. 12, 2011 for PCT/JP2011/004534 filed on Aug. 10, 2011 in English.
(Continued)

*Primary Examiner* — William D Coleman
(74) *Attorney, Agent, or Firm* — Oblon, Spivak, McClelland, Maier & Neustadt, L.L.P.

(57) ABSTRACT

According to one embodiment, a light emitting device includes a semiconductor layer, a p-side electrode, an n-side electrode, a first insulating layer, a p-side interconnect layer, an n-side interconnect layer and a second insulating layer. The semiconductor layer includes a first surface, a second surface opposite to the first surface, and a light emitting layer. The p-side electrode is provided on the second surface in a region including the light emitting layer. The n-side electrode is provided on the second surface in a region not including the light emitting layer. The p-side interconnect layer includes a p-side external terminal exposed from the second insulating layer at a third surface having a plane orientation different from a plane orientation of the first surface and a plane orientation of the second surface. The n-side interconnect layer includes an n-side external terminal exposed from the second insulating layer at the third surface.

20 Claims, 35 Drawing Sheets

(51) Int. Cl.
    *H01L 21/28* (2006.01)
    *H01L 33/48* (2010.01)
    *H01L 33/62* (2010.01)
    H01L 23/498 (2006.01)
    H01L 33/50 (2010.01)
    H01L 33/52 (2010.01)

(52) U.S. Cl.
    CPC ........... *H01L 23/49805* (2013.01); *H01L 33/50* (2013.01); *H01L 33/52* (2013.01); *H01L 2924/0002* (2013.01)
    USPC .............................................. 257/96; 438/621

(56) References Cited

U.S. PATENT DOCUMENTS

| | | | |
|---|---|---|---|
| 8,110,421 B2 | 2/2012 | Sugizaki et al. | |
| 8,148,183 B2 | 4/2012 | Hamasaki et al. | |
| 8,211,750 B2 | 7/2012 | Ohsumi | |
| 8,278,676 B2 | 10/2012 | Kojima et al. | |
| 8,288,843 B2 | 10/2012 | Kojima et al. | |
| 8,319,246 B2 | 11/2012 | Sugizaki et al. | |
| 8,350,285 B2 | 1/2013 | Sugizaki et al. | |
| 8,367,523 B2 | 2/2013 | Sugizaki et al. | |
| 8,368,089 B2 | 2/2013 | Kojima et al. | |
| 8,373,192 B2 | 2/2013 | Sugizaki et al. | |
| 8,377,726 B2 | 2/2013 | Kojima et al. | |
| 8,378,377 B2 | 2/2013 | Sugizaki et al. | |
| 8,436,378 B2 | 5/2013 | Kojima et al. | |
| 8,445,916 B2 | 5/2013 | Kojima et al. | |
| 8,614,455 B2 * | 12/2013 | Obata et al. ..................... | 257/98 |
| 2006/0065964 A1 | 3/2006 | Ohsumi | |
| 2008/0093607 A1 | 4/2008 | Feng et al. | |
| 2008/0101062 A1 | 5/2008 | Feng et al. | |
| 2010/0140640 A1 | 6/2010 | Shimokawa et al. | |
| 2011/0204396 A1 | 8/2011 | Akimoto et al. | |
| 2011/0220931 A1 | 9/2011 | Kojima et al. | |
| 2011/0284909 A1 | 11/2011 | Sugizaki et al. | |
| 2011/0284910 A1 | 11/2011 | Iduka et al. | |
| 2011/0291148 A1 | 12/2011 | Sugizaki et al. | |
| 2011/0297965 A1 | 12/2011 | Akimoto et al. | |
| 2011/0297980 A1 | 12/2011 | Sugizaki et al. | |
| 2011/0297995 A1 | 12/2011 | Akimoto et al. | |
| 2011/0298001 A1 | 12/2011 | Akimoto et al. | |
| 2011/0300651 A1 | 12/2011 | Kojima et al. | |
| 2012/0097972 A1 | 4/2012 | Sugizaki et al. | |

FOREIGN PATENT DOCUMENTS

| | | |
|---|---|---|
| JP | 2002-118293 | 4/2002 |
| JP | 2005-079550 | 3/2005 |
| JP | 2005-079551 | 3/2005 |
| JP | 2197051 | 6/2010 |
| TW | 201031033 A1 | 8/2010 |

OTHER PUBLICATIONS

International Written Opinion issued on Jan. 12, 2011 for PCT/JP2011/004534 filed on Aug. 10, 2011 in English.

Combined Office Action and Search Report issued Mar. 17, 2014 in Taiwanese Patent Application No. 100133436 with English language translation Office Action issued Oct. 24, 2014 in Taiwanese Patent Application No. 100133436 (with English translation).

* cited by examiner

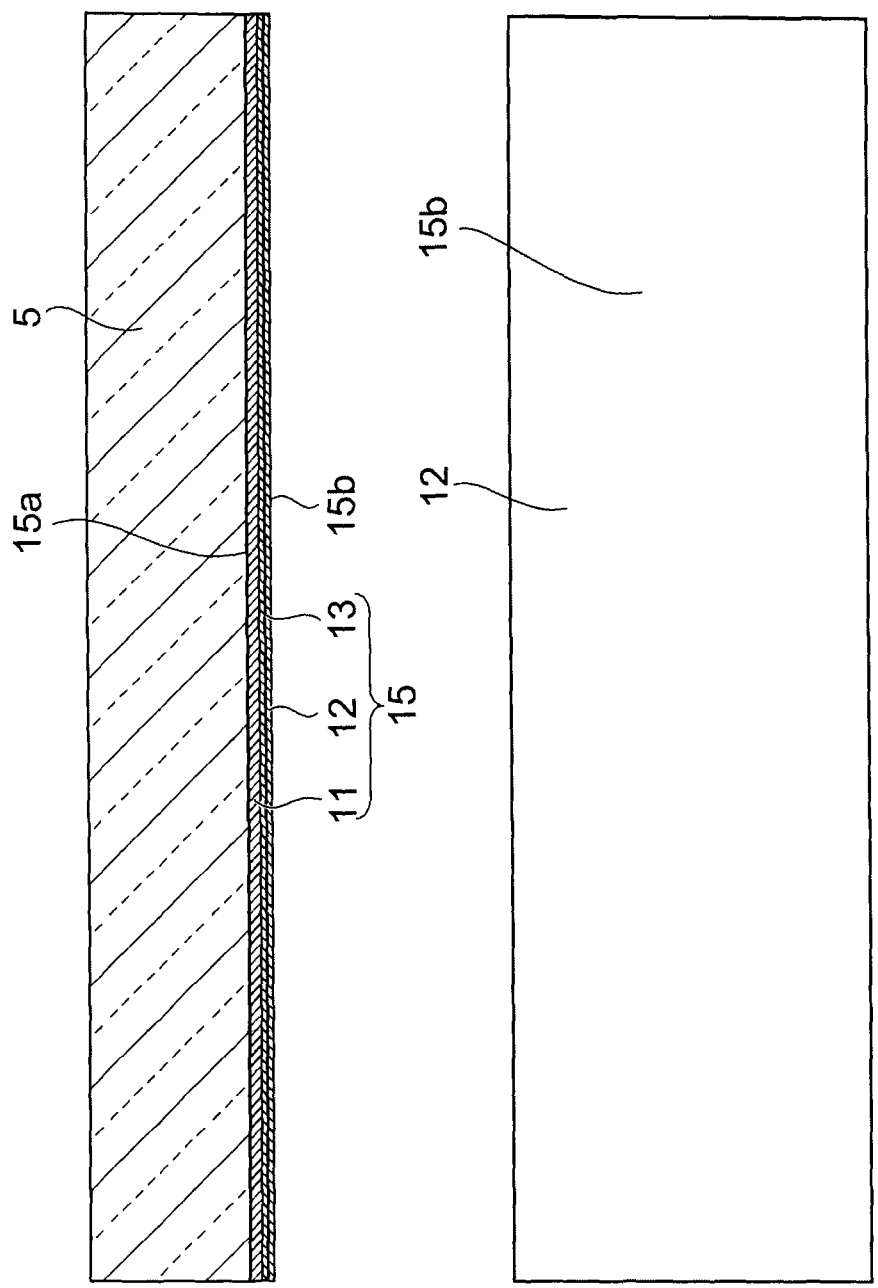

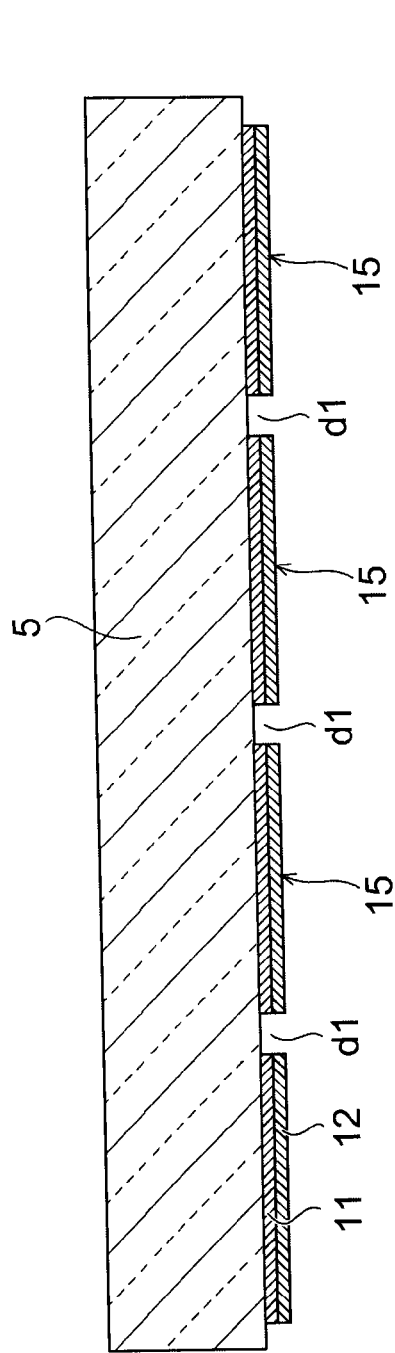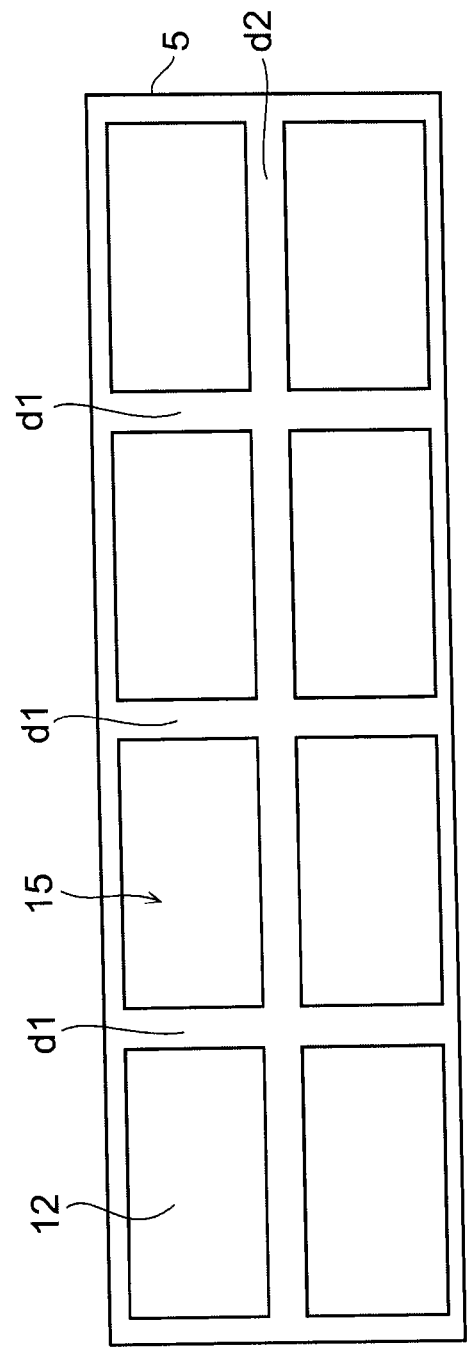
FIG. 4A
FIG. 4B

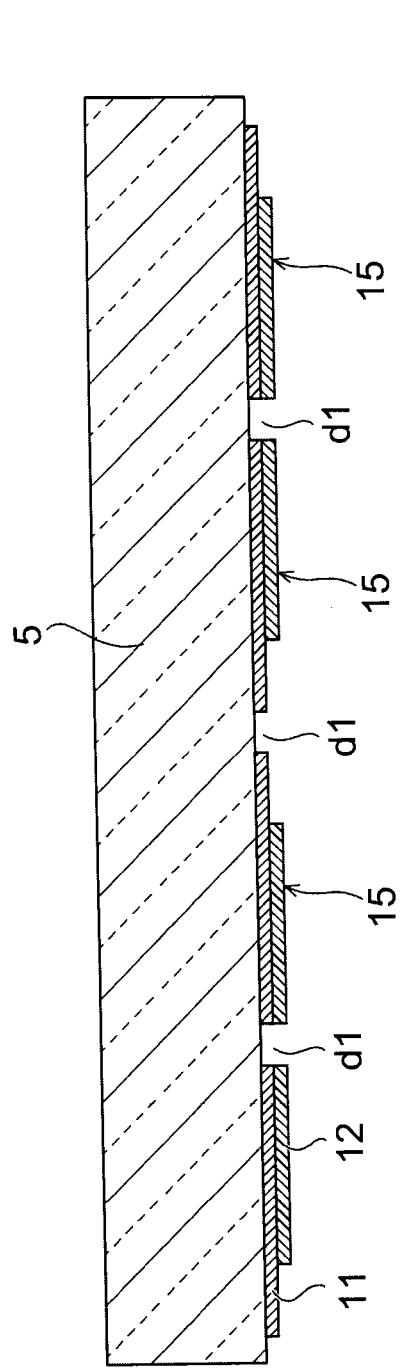
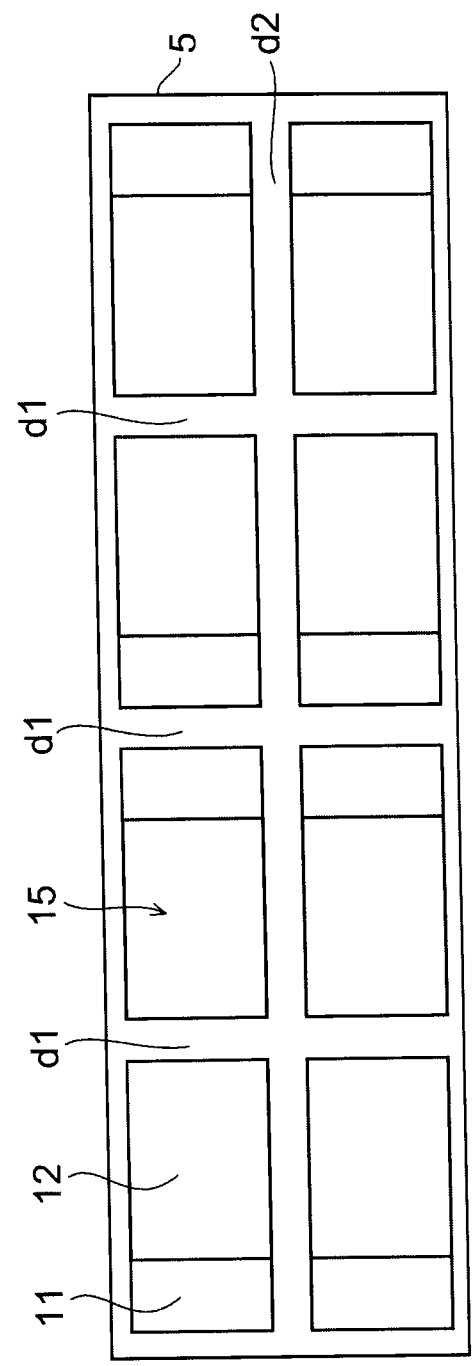
FIG. 5A
FIG. 5B

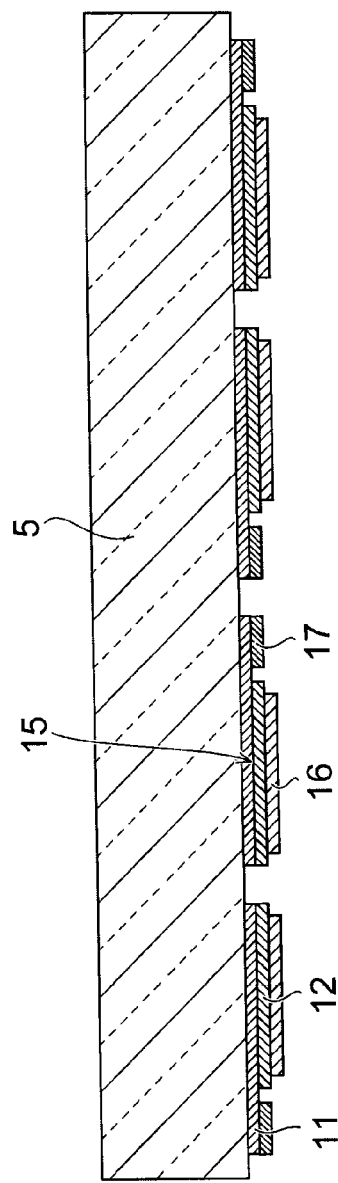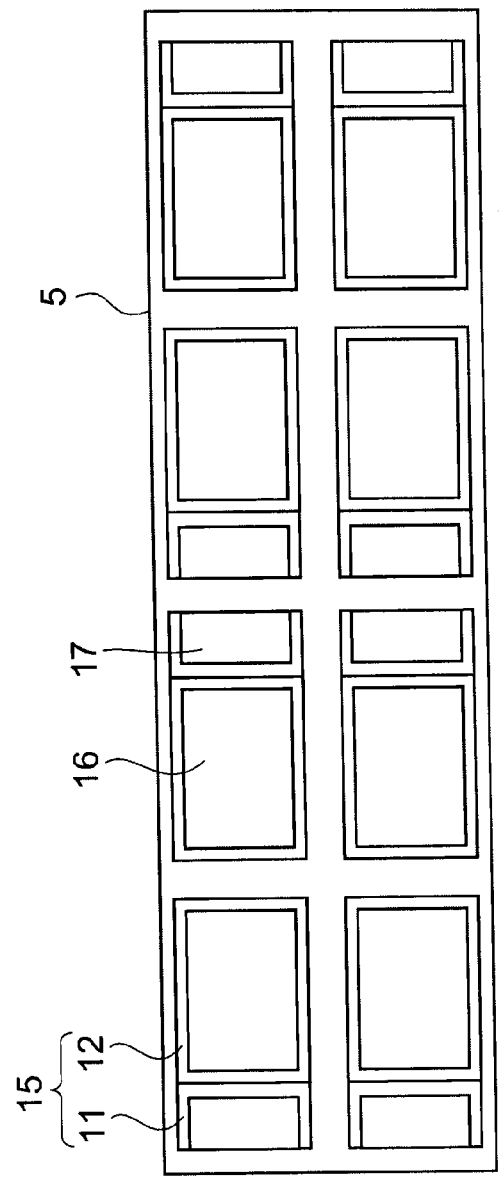
FIG. 6A
FIG. 6B

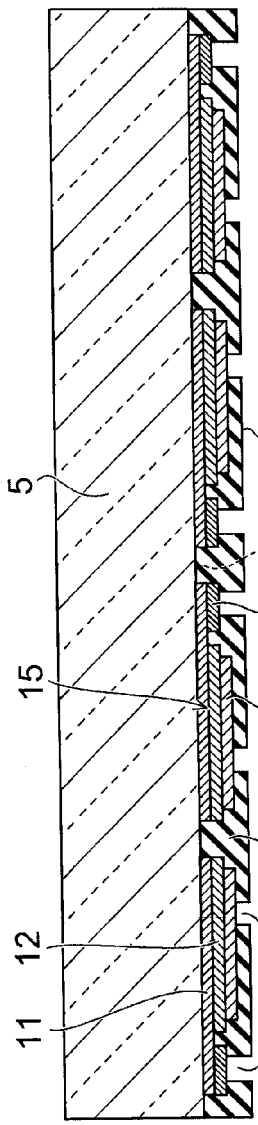
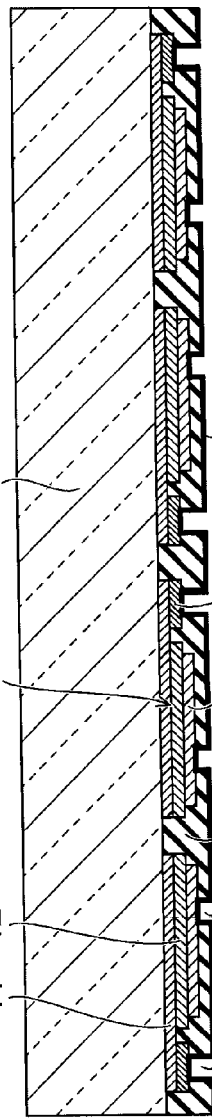
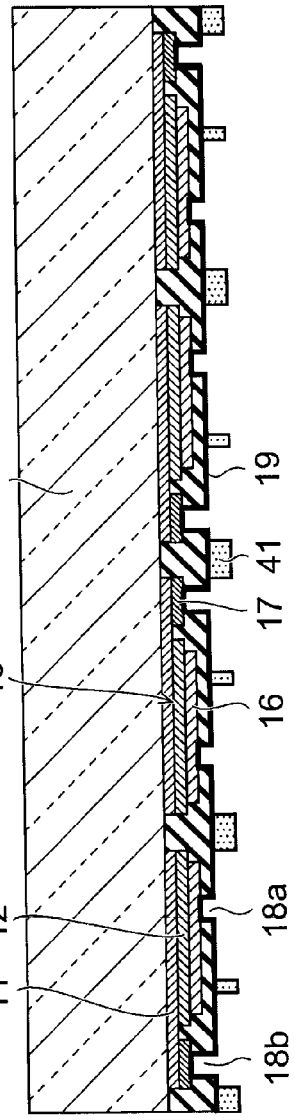
FIG. 7A
FIG. 7B
FIG. 7C

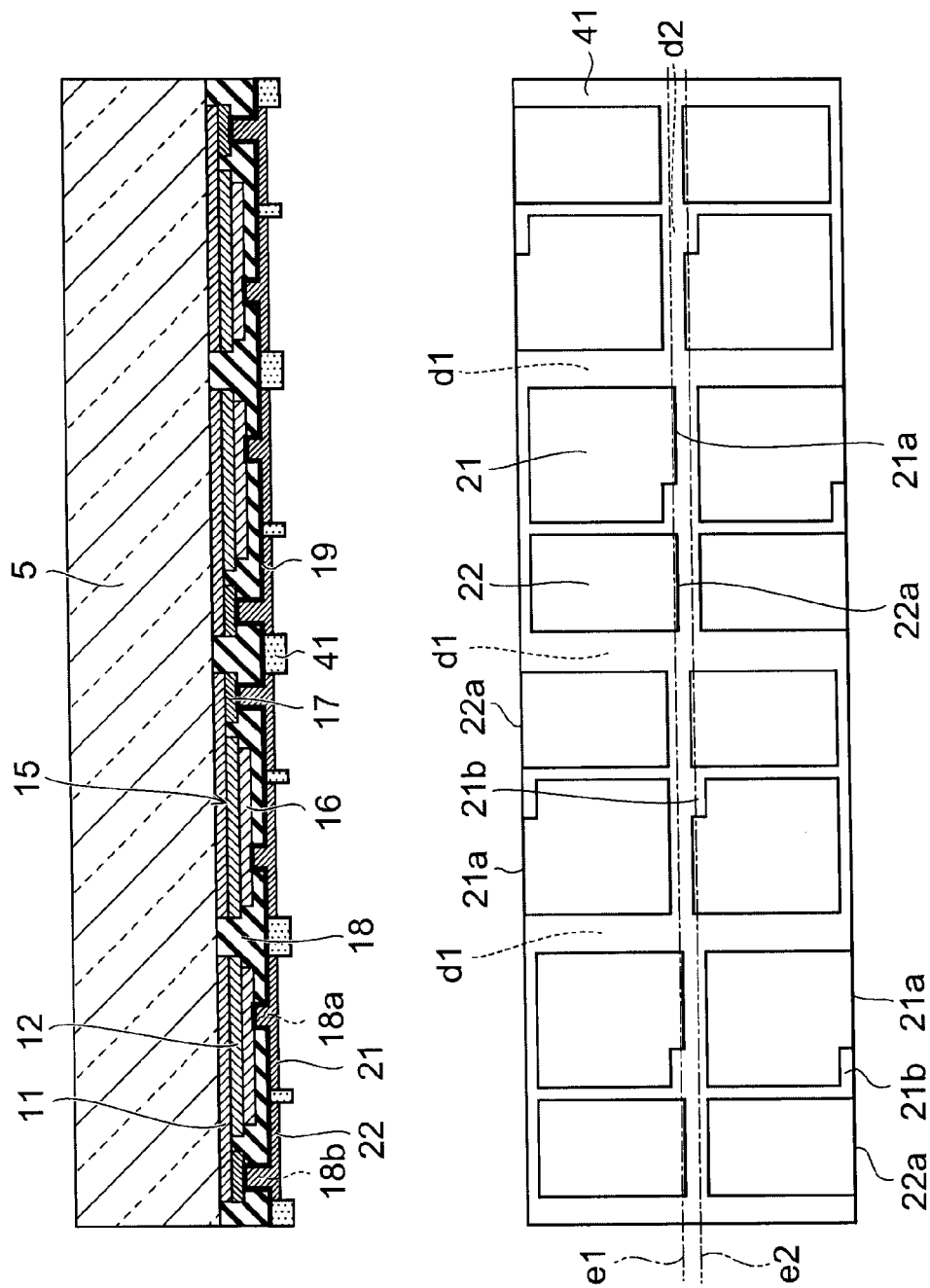

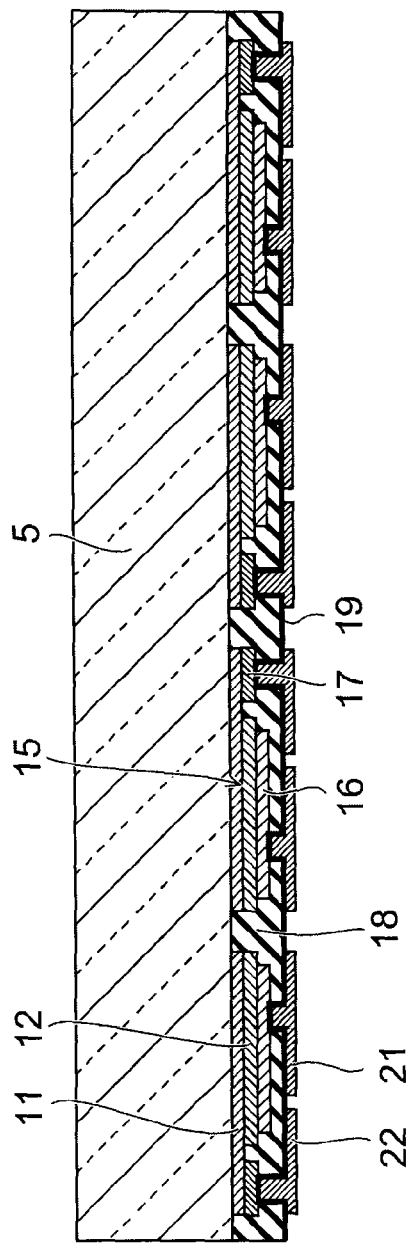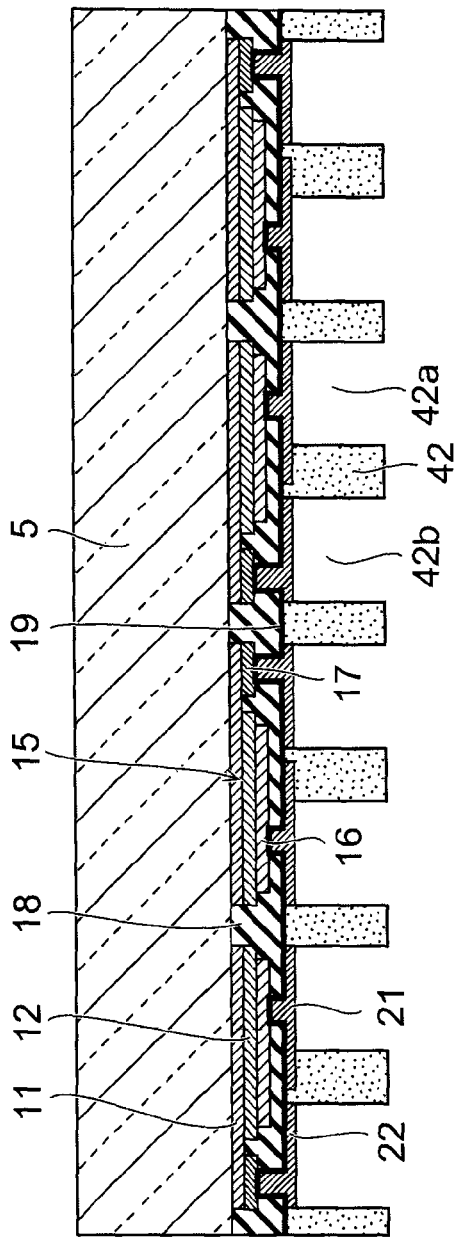
FIG. 9A
FIG. 9B

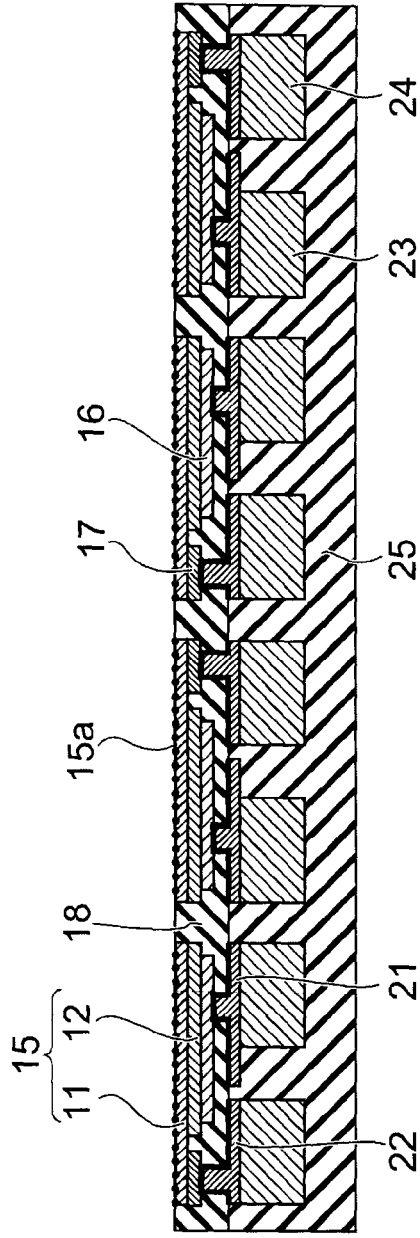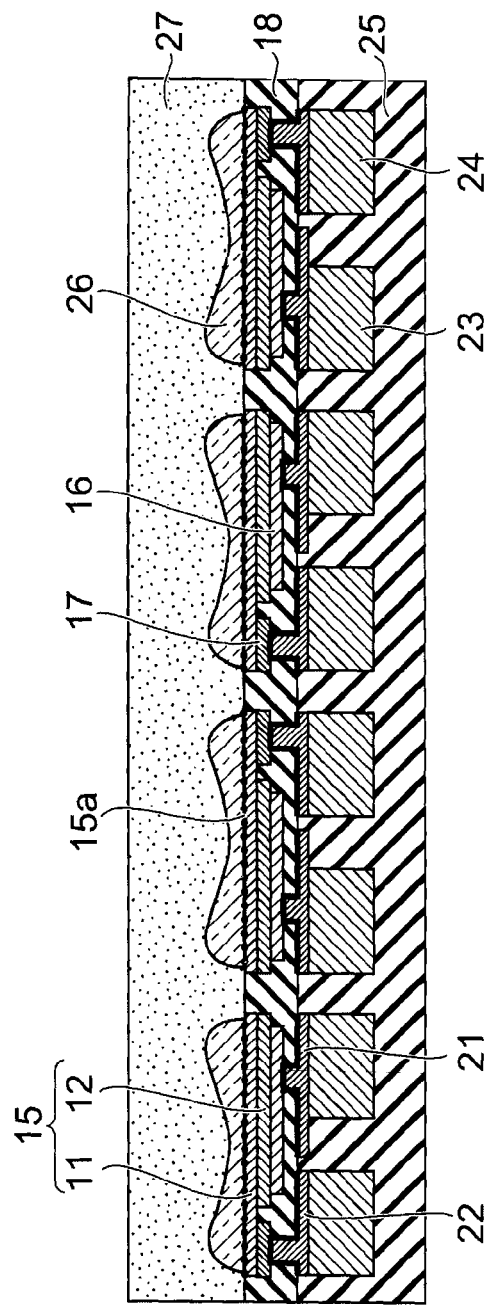
FIG. 13A
FIG. 13B

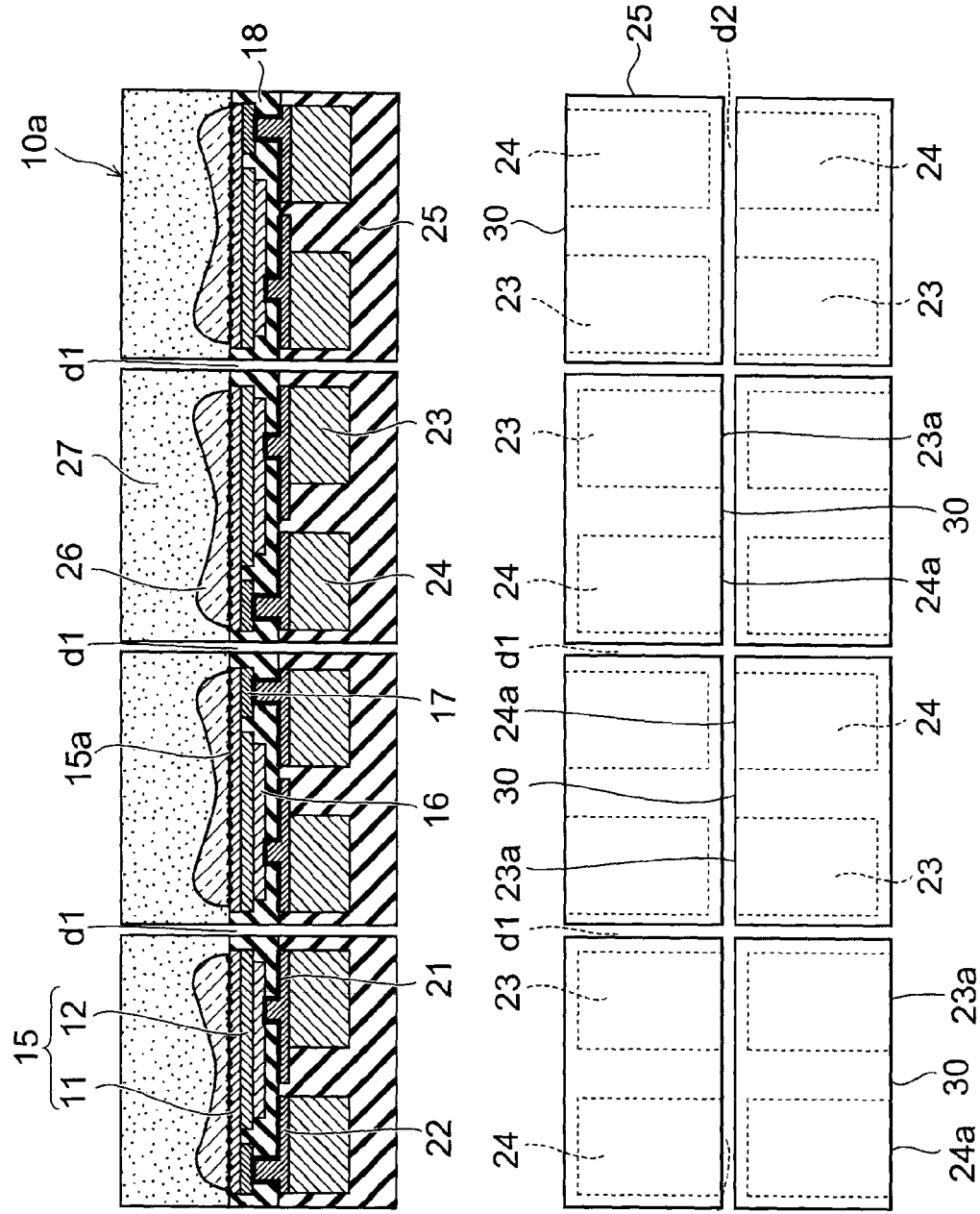

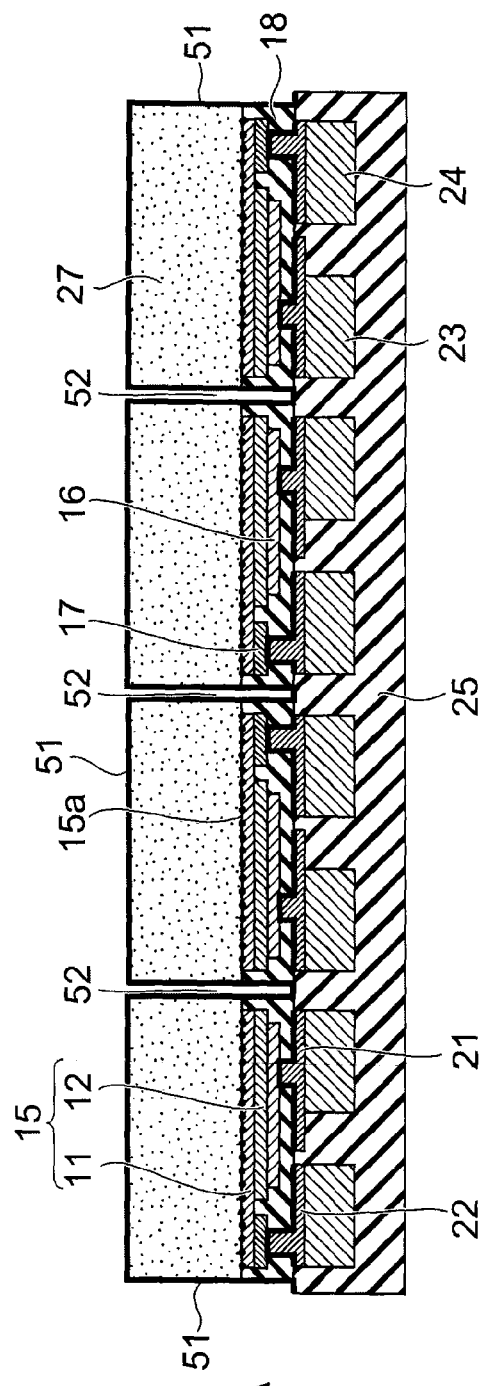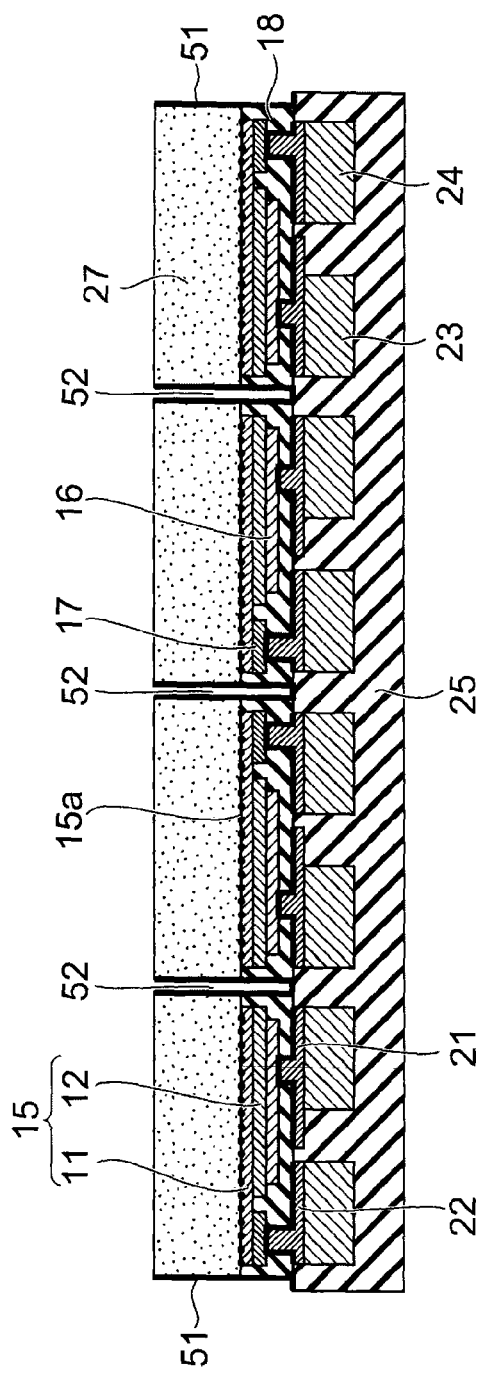

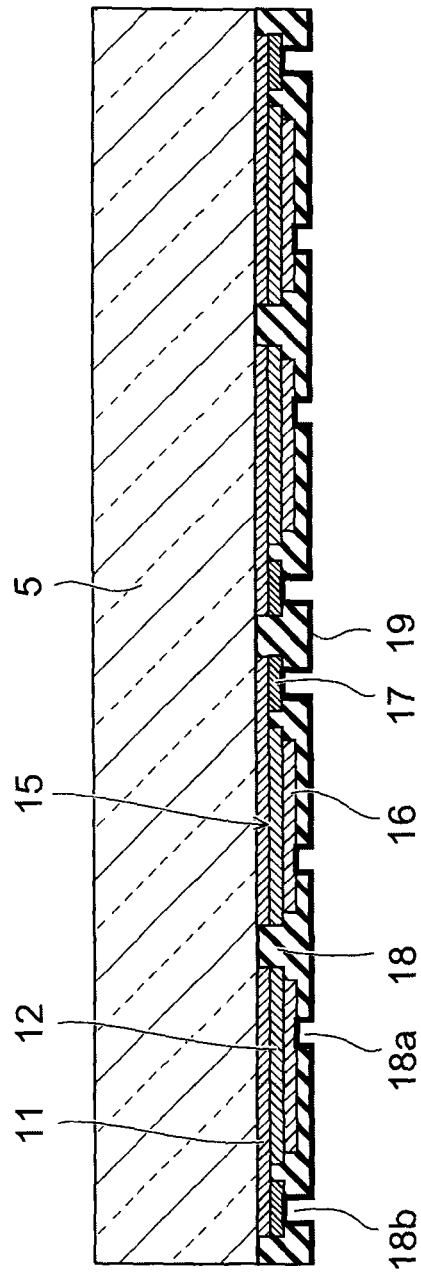
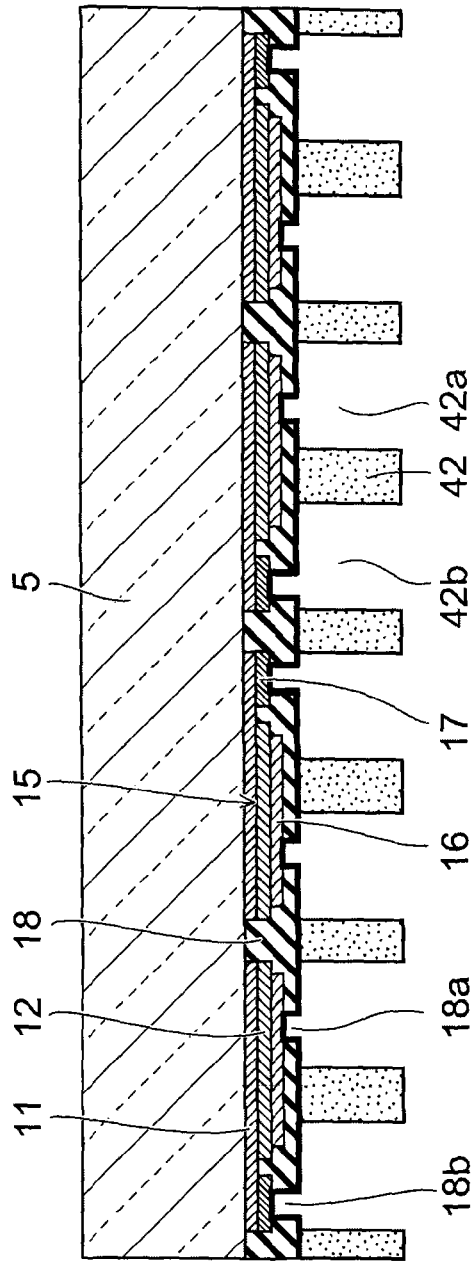
FIG. 24A
FIG. 24B

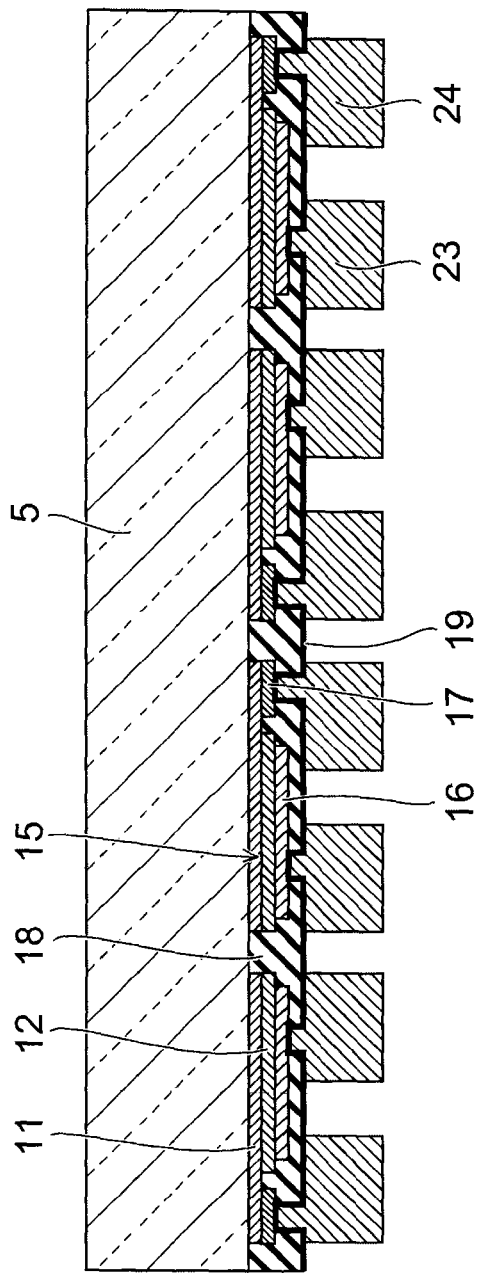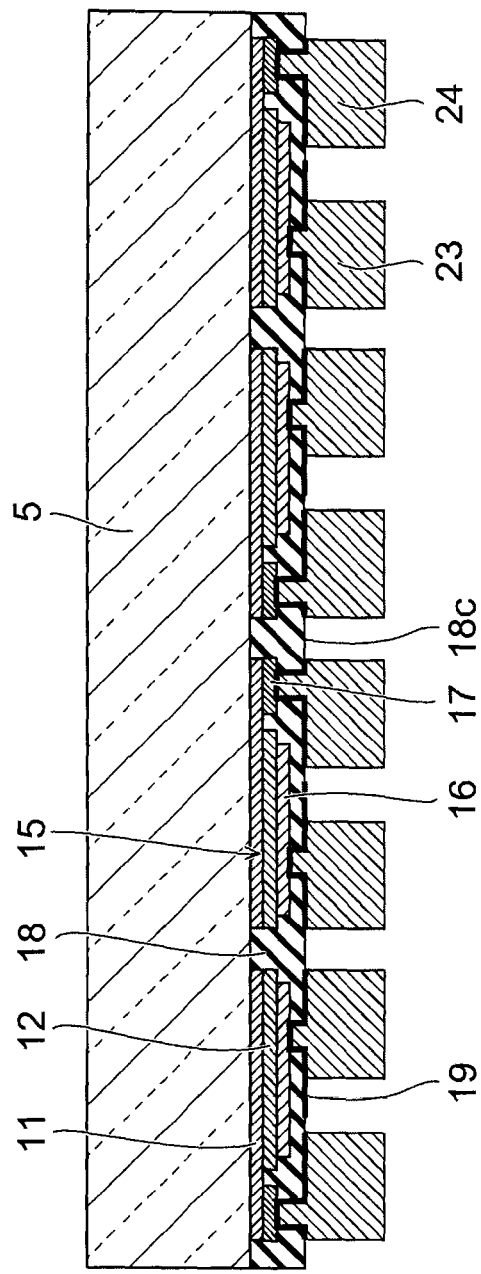
FIG. 26A
FIG. 26B

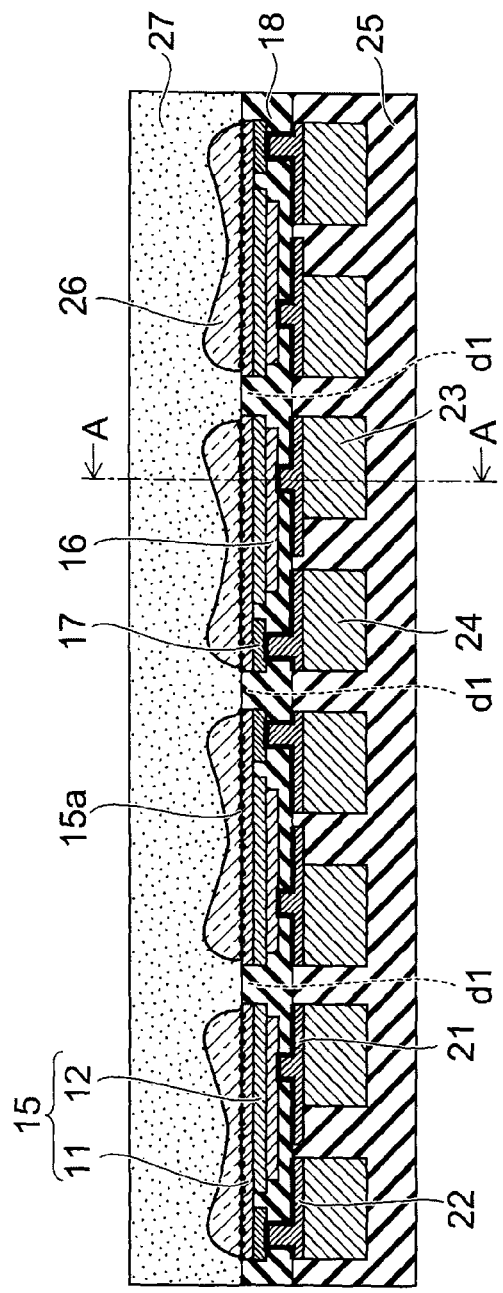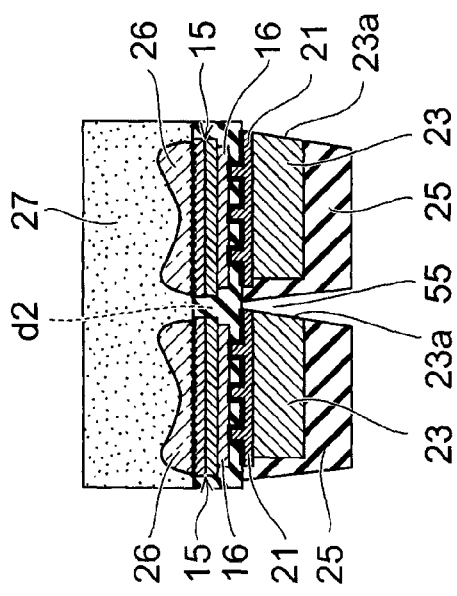
FIG. 32A
FIG. 32B

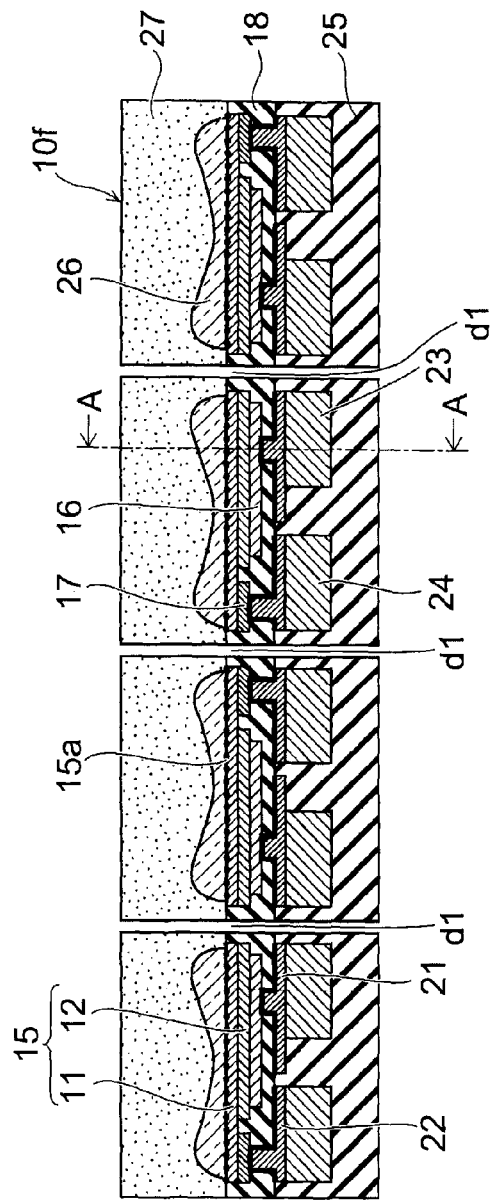
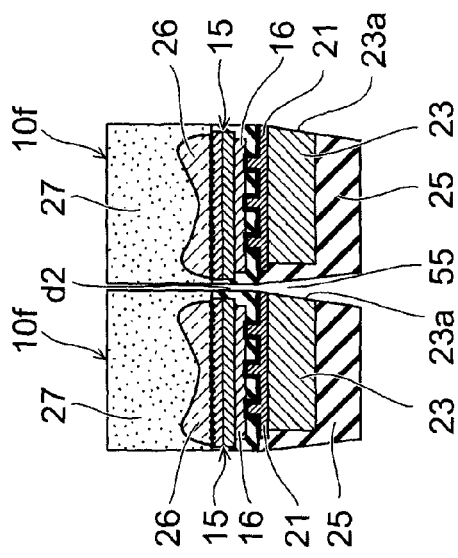
FIG. 33A
FIG. 33B

LIGHT EMITTING DEVICE, LIGHT EMITTING MODULE, AND METHOD FOR MANUFACTURING LIGHT EMITTING DEVICE

CROSS-REFERENCE TO RELATED APPLICATIONS

This is a continuation application of International Application PCT/JP2011/004534, filed on Aug. 10, 2011; the entire contents of which are incorporated herein by reference. This application also claims priority to Japanese Application No. 2011-005625, filed on Jan. 14, 2011. The entire contents of each are incorporated herein by reference.

FIELD

Embodiments of this invention are concerning a light emitting device, a light emitting module, and a method for manufacturing a light emitting device.

BACKGROUND

Applications of semiconductor light emitting devices capable of emitting visible light or white light are expanding to illumination apparatuses, backlight light sources of liquid crystal display apparatuses, display apparatuses, etc. The need to downsize in such applications is increasing more and more. And there is a need to further increase the suitability for mass production and decrease the price of the semiconductor light emitting devices.

BRIEF DESCRIPTION OF THE DRAWINGS

FIGS. 3A to 15B are schematic views showing a method for manufacturing the light emitting device of the first embodiment;

FIGS. 19A to 21B are schematic views showing a method for manufacturing the light emitting device of the second embodiment;

FIGS. 24A to 29B are schematic views showing a method for manufacturing the light emitting device of the third embodiment;

FIGS. 32A to 33B are schematic views showing a method for manufacturing the light emitting device of the fourth embodiment;

DETAILED DESCRIPTION

Figure 1A:
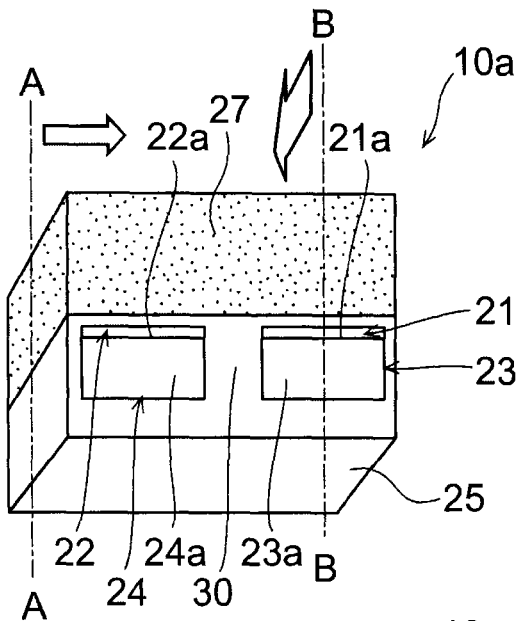
FIGS. 1A to 1C are schematic views of a light emitting device of a first embodiment.

According to one embodiment, a light emitting device includes a semiconductor layer, a p-side electrode, an n-side electrode, a first insulating layer, a p-side interconnect layer, an n-side interconnect layer and a second insulating layer. The semiconductor layer includes a first surface, a second surface opposite to the first surface, and a light emitting layer. The p-side electrode is provided on the second surface in a region including the light emitting layer. The n-side electrode is provided on the second surface in a region not including the light emitting layer. The first insulating layer is provided on the second surface side. The first insulating layer has a first via communicating with the p-side electrode and a second via communicating with the n-side electrode. The first insulating layer has an interconnect surface opposite to the semiconductor layer. The p-side interconnect layer is provided at least inside the first via. The p-side interconnect layer is electrically connected to the p-side electrode. The n-side interconnect layer is provided apart from the p-side interconnect layer inside the second via and on the interconnect surface. The interconnect surface is formed on a side opposite to the semiconductor layer. The n-side interconnect layer is electrically connected to the n-side electrode. The second insulating layer is provided at least between the p-side interconnect layer and the n-side interconnect layer.

The p-side interconnect layer includes a p-side external terminal exposed from the second insulating layer at a third surface having a plane orientation different from a plane orientation of the first surface and a plane orientation of the second surface. The n-side interconnect layer includes an n-side external terminal exposed from the second insulating layer at the third surface.

Various embodiments will now be described hereinafter with reference to the accompanying drawings. Similar components in the drawings are marked with like reference numerals. In the drawings illustrating manufacturing processes, a region of a portion of a wafer including multiple semiconductor layers 15 (chips) is illustrated.

First Embodiment

Figure 1B:
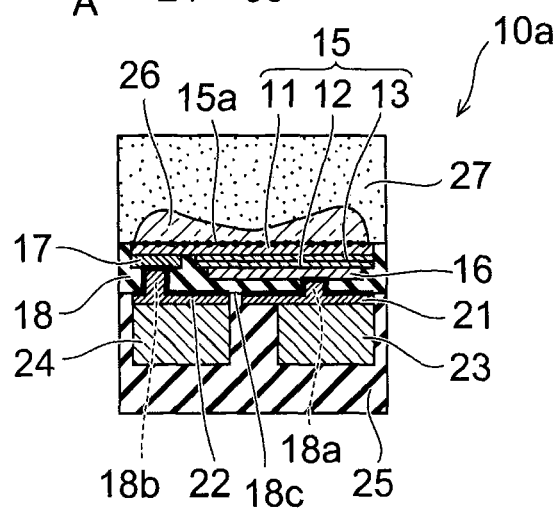
Figure 1C:
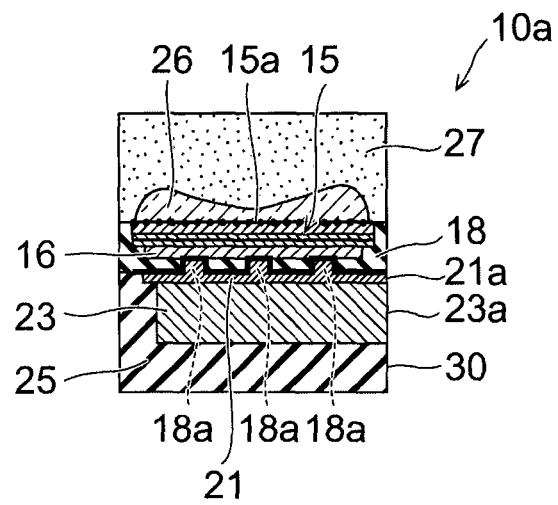

FIG. 1A is a schematic perspective view of a light emitting device 10a of a first embodiment. FIG. 1B is an A-A cross-sectional view of FIG. 1A. FIG. 1C is a B-B cross-sectional view of FIG. 1A.

The light emitting device 10a includes the semiconductor layer 15. The semiconductor layer 15 includes a first surface 15a and a second surface opposite to the first surface 15a. Electrodes and interconnect layers are provided on the second surface side. Light is emitted to the outside mainly from the first surface 15a opposite to the second surface.

The semiconductor layer 15 includes a first semiconductor layer 11 and a second semiconductor layer 12. Both the first semiconductor layer 11 and the second semiconductor layer 12 include, for example, a nitride semiconductor. The first semiconductor layer 11 includes, for example, a foundation buffer layer, an n-type layer, etc. The n-type layer functions as a lateral-direction path of current. The second semiconductor layer 12 includes a stacked structure in which a light emitting layer (an active layer) 13 is interposed between the n-type layer and a p-type layer.

The second surface side of the semiconductor layer 15 is patterned into an uneven configuration. The protrusion formed on the second surface side includes the light emitting layer 13. A p-side electrode 16 is provided on the top surface of the second semiconductor layer 12 which is the top surface of the protrusion. The p-side electrode 16 is provided in the region including the light emitting layer 13.

A region where there is no second semiconductor layer 12 is provided on the second surface side of the semiconductor layer 15 beside the protrusion, and an n-side electrode 17 is provided on the top surface of the first semiconductor layer 11 of the region. The n-side electrode 17 is provided in a region not including the light emitting layer 13.

On the second surface side of the semiconductor layer 15 as illustrated in FIG. 5B, the surface area of the second semiconductor layer 12 including the light emitting layer 13 is greater than the surface area of the first semiconductor layer 11 not including the light emitting layer 13.

In one semiconductor layer 15 as illustrated in FIG. 6B, the p-side electrode 16 provided in the region including the light emitting layer 13 has a surface area greater than that of the n-side electrode 17 not including the light emitting layer 13. Thereby, a wide light emitting region is obtained. The layout of the p-side electrode 16 and the n-side electrode 17 illustrated in FIG. 6B is one example and is not limited thereto.

A first insulating layer (hereinbelow referred to as simply the insulating layer) 18 is provided on the second surface side of the semiconductor layer 15. The insulating layer 18 covers the semiconductor layer 15, the p-side electrode 16, and the n-side electrode 17. There are also cases where another insulating film (e.g., a silicon oxide film) is provided between the insulating layer 18 and the semiconductor layer 15. The insulating layer 18 is, for example, a resin such as polyimide having excellent patternability for ultra-fine openings. Alternatively, an inorganic substance such as silicon oxide, silicon nitride, etc., may be used as the insulating layer 18.

The insulating layer 18 includes an interconnect surface 18c on the side opposite to the semiconductor layer 15. A p-side metal plate layer 21 and an n-side metal plate layer 22 are provided separately from each other on the interconnect surface 18c. The p-side metal plate layer 21 is provided also inside a first via 18a made in the insulating layer 18 to reach the p-side electrode 16 and is electrically connected to the p-side electrode 16. It is not always necessary for the p-side metal plate layer 21 to be formed on the insulating layer 18. For example, a structure may be used in which the p-side metal plate layer 21 is provided only on the p-side electrode 16.

The n-side metal plate layer 22 is provided also inside a second via 18b made in the insulating layer 18 to reach the n-side electrode 17 and is electrically connected to the n-side electrode 17.

A p-side metal pillar 23 is provided on the surface of the p-side metal plate layer 21 on the side opposite to the p-side electrode 16. The p-side metal plate layer 21 and the p-side metal pillar 23 are included in the p-side interconnect layer of the embodiment.

An n-side metal pillar 24 is provided on the surface of the n-side metal plate layer 22 on the side opposite to the n-side electrode 17. The n-side metal plate layer 22 and the n-side metal pillar 24 are included in the n-side interconnect layer of the embodiment.

A resin layer 25 is provided as the second insulating layer on the interconnect surface 18c of the insulating layer 18. The resin layer 25 covers the p-side metal plate layer 21 and the n-side metal plate layer 22. However, as illustrated in FIG. 1A, a side surface 21a of the p-side metal plate layer 21 and a side surface 22a of the n-side metal plate layer 22 are exposed without being covered with the resin layer 25.

The resin layer 25 covers the end surface of the p-side metal pillar 23 on the side opposite to the p-side metal plate layer 21 and the end surface of the n-side metal pillar 24 on the side opposite to the n-side metal plate layer 22. Further, the resin layer 25 covers a portion of the side surface of the p-side metal pillar 23 and a portion of the side surface of the n-side metal pillar 24.

As illustrated in FIGS. 1A and 1C, a side surface of a portion of the p-side metal pillar 23 is exposed from the resin layer 25 at a third surface 30 having a plane orientation different from those of the first surface 15a and the second surface of the semiconductor layer 15. The exposed surface functions as a p-side external terminal 23a for mounting to the external mounting substrate.

Here, the third surface 30 is a surface substantially perpendicular to the first surface 15a and the second surface. The resin layer 25 has, for example, four side surfaces which have rectangular configurations. One of the side surfaces having a relatively long side is the third surface 30.

A side surface of a portion of the n-side metal pillar 24 is exposed from the resin layer 25 at the third surface 30. The exposed surface functions as an n-side external terminal 24a for mounting to the external mounting substrate.

Further, as illustrated in FIG. 1A, the side surface 21a of the p-side metal plate layer 21 also is exposed from the resin layer 25 at the third surface 30 and functions as the p-side external terminal. Similarly, the side surface 22a of the n-side metal plate layer 22 also is exposed from the resin layer 25 at the third surface 30 and functions as the n-side external terminal.

In the first embodiment illustrated in FIGS. 1A to 1C, the portion of the p-side metal pillar 23 other than the p-side external terminal 23a exposed at the third surface 30 is covered with the resin layer 25. Further, the portion of the n-side metal pillar 24 other than the n-side external terminal 24a exposed at the third surface 30 is covered with the resin layer 25. The structure of the embodiment is one example; and portions of the p-side metal pillar 23 and the n-side metal pillar 24 may be exposed somewhere other than the third surface 30.

In the first embodiment illustrated in FIGS. 1A to 1C, the portion of the p-side metal plate layer 21 other than the side surface 21a exposed at the third surface 30 is covered with the resin layer 25. Further, the portion of the n-side metal plate layer 22 other than the side surface 22a exposed at the third surface 30 is covered with the resin layer 25. The structure of the embodiment is one example; and portions of the p-side metal plate layer 21 and the n-side metal plate layer 22 may be exposed somewhere other than the third surface 30.

The distance between the side surface 21a of the p-side metal plate layer 21 exposed at the third surface 30 and the side surface 22a of the n-side metal plate layer 22 exposed at the third surface 30 is greater than the distance between the p-side metal plate layer 21 and the n-side metal plate layer 22 (referring to FIG. 8B) on the interconnect surface 18c of the insulating layer 18.

By reducing the distance between the p-side metal plate layer 21 and the n-side metal plate layer 22 covered with the resin layer 25 on the interconnect surface 18c of the insulating layer 18, the surface area of the p-side metal plate layer 21 can be enlarged. The planar size of the p-side metal plate layer 21 is greater than the planar size of the p-side metal pillar 23. The p-side metal plate layer 21 can be formed using a low-resistance metal such as, for example, copper. Therefore, it is possible to supply current to the second semiconductor layer 12 with a more uniform distribution as the surface area of the p-side metal plate layer 21 increases. Further, the thermal conductivity of the p-side metal plate layer 21 also can be increased. And it is possible also to efficiently release the heat of the second semiconductor layer 12.

The p-side electrode 16 spreads to the region which includes the light emitting layer 13. Accordingly, by connecting the p-side metal plate layer 21 and the p-side electrode 16 via the multiple first vias 18a, the current distribution to the light emitting layer 13 can be improved and the heat dissipation of the heat of the light emitting layer 13 also can be improved.

The side surface 21a of the p-side metal plate layer 21 exposed at the third surface 30 and the side surface 22a of the n-side metal plate layer 22 exposed at the third surface 30 are separated by a distance such that the side surface 21a and the side surface 22a are not shorted to each other by the bonding material such as solder for mounting to the mounting substrate.

The contact area between the n-side metal plate layer 22 and the n-side metal pillar 24 is greater than the contact area between the n-side metal plate layer 22 and the n-side electrode 17. Also, a portion of the n-side metal plate layer 22 extends over the interconnect surface 18c of the insulating layer 18 to a position extending under the light emitting layer 13.

Thereby, an electrode having a wider draw-out can be formed via the n-side metal plate layer 22 from the n-side electrode 17 provided in the narrow region not including the light emitting layer 13 while obtaining a high light output by the light emitting layer 13 being formed over a wide region.

The contact area between the p-side metal plate layer 21 and the p-side metal pillar 23 is greater than the contact area between the p-side metal plate layer 21 and the p-side electrode 16. Alternatively, the contact area between the p-side metal plate layer 21 and the p-side metal pillar 23 is less than the contact area between the p-side metal plate layer 21 and the p-side electrode 16.

The first semiconductor layer 11 is electrically connected to the n-side metal pillar 24 via the n-side electrode 17 and the n-side metal plate layer 22. The second semiconductor layer 12 including the light emitting layer 13 is electrically connected to the p-side metal pillar 23 via the p-side electrode 16 and the p-side metal plate layer 21.

The p-side metal pillar 23 is thicker than the p-side metal plate layer 21, and the n-side metal pillar 24 is thicker than the n-side metal plate layer 22. Therefore, the mechanical strength of the light emitting device 10a can be increased by the p-side metal pillar 23, the n-side metal pillar 24, and the resin layer 25 filled between the p-side metal pillar 23 and the n-side metal pillar 24 even without a substrate supporting the semiconductor layer 15.

Copper, gold, nickel, silver, etc., can be used as the material of the p-side metal plate layer 21, the n-side metal plate layer 22, the p-side metal pillar 23, and the n-side metal pillar 24. Of these, in the case where copper is used, good thermal conductivity, high migration resistance, and excellent adhesion with the insulating material are obtained.

The resin layer 25 reinforces the p-side metal pillar 23 and the n-side metal pillar 24. It may be used the resin layer 25 to have a coefficient of thermal expansion near to or the same as that of the mounting substrate. Examples of such a resin layer 25 include an epoxy resin, a silicone resin, a fluorocarbon resin, etc.

A lens 26 and a phosphor layer 27 are provided on the first surface 15a of the semiconductor layer 15 as a transparent body transparent to the light emitted from the light emitting layer 13. The lens 26 is provided on the first surface 15a. The phosphor layer 27 is provided to cover the lens 26.

The planar size of the stacked body including each of the components described above provided on the second surface side of the semiconductor layer 15 is substantially the same as the planar size of the phosphor layer 27. The lens 26 and the phosphor layer 27 do not obstruct the mounting onto the mounting substrate of the light emitting device 10a because the lens 26 and the phosphor layer 27 do not protrude on the third surface 30 side.

The phosphor layer 27 includes a transparent resin and a phosphor dispersed in the transparent resin. The phosphor layer 27 is capable of absorbing the light emitted from the light emitting layer 13 and emitting a wavelength-converted light. Therefore, the light emitting device 10a is capable of emitting a mixed light of the light from the light emitting layer 13 and the wavelength-converted light of the phosphor layer 27.

For example, white or lamp, etc., can be obtained as the mixed color of a blue light from the light emitting layer 13 and a yellow light which is the wavelength-converted light of the phosphor layer 27 in the case where the light emitting layer 13 is a nitride semiconductor and the phosphor is a yellow phosphor configured to emit the yellow light. The phosphor layer 27 may have a configuration including multiple types of phosphors (e.g., a red phosphor configured to emit red light and a green phosphor configured to emit green light).

The light emitted from the light emitting layer 13 is emitted to the outside by traveling through mainly the first semiconductor layer 11, the first surface 15a, the lens 26, and the phosphor layer 27. The lens 26 may be provided on the phosphor layer 27.

Figure 2:
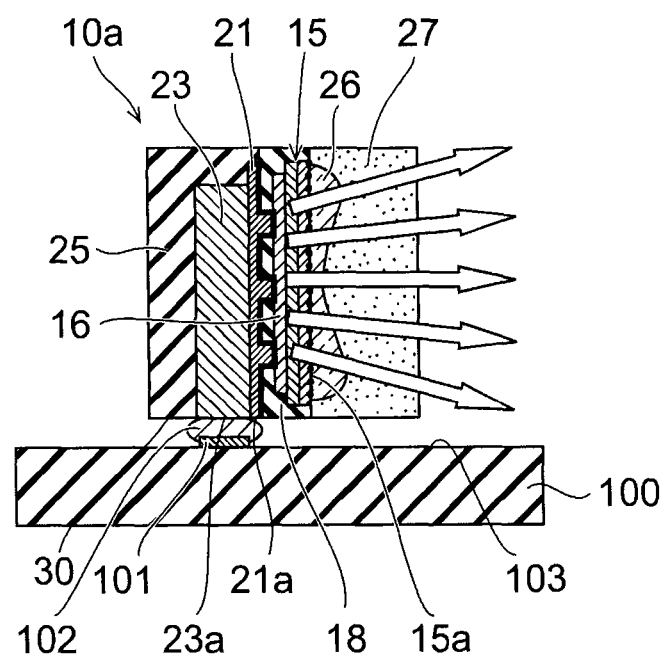
FIG. 2 is a schematic cross-sectional view of a light emitting module of the first embodiment.

FIG. 2 is a schematic cross-sectional view of a light emitting module having a configuration in which the light emitting device 10a described above is mounted on a mounting substrate 100.

The number of the light emitting devices 10a mounted on the mounting substrate 100 is arbitrary and may be singular or multiple. Multiple light emitting devices 10a may be included in a line-shaped light source by being arranged along some one direction.

The light emitting device 10a is mounted with an attitude in which the third surface 30 is oriented toward a mounting surface 103 of the mounting substrate 100. Each of the p-side external terminal 23a and the n-side external terminal 24a exposed at the third surface 30 is bonded with solder 102 to a pad 101 formed on the mounting surface 103. An interconnect pattern also is formed on the mounting surface 103 of the mounting substrate 100. The pad 101 is connected to the interconnect pattern.

The third surface 30 is substantially perpendicular to the first surface 15a which is the main emitting surface of the light. Accordingly, the first surface 15a is oriented not upward from the mounting surface 103 but in the lateral direction with an attitude in which the third surface 30 is oriented downward toward the mounting surface 103 side. In other words, a so-called side-view type light emitting device 10a and light emitting module are obtained in which the light is emitted in the lateral direction in the case where the mounting surface 103 is a horizontal surface.

The thickness of the p-side metal pillar 23 and the thickness of the n-side metal pillar 24 (the thicknesses in the vertical direction in FIG. 1B) are thicker than the thickness of the stacked body including the semiconductor layer 15, the p-side electrode 16, the n-side electrode 17, and the insulating layer 18. The aspect ratio (the ratio of the thickness to the planar size) of each of the metal pillars 23 and 24 is not limited to being not less than 1; and the ratio thereof may be less than 1. In other words, it is sufficient for the thicknesses of the metal pillars 23 and 24 to be less than the planar sizes thereof.

According to the embodiment, it is possible to maintain the mechanical strength by the p-side metal pillar 23, the n-side metal pillar 24, and the resin layer 25 being thick even in the case where the semiconductor layer 15 is thin and there is no substrate to support the semiconductor layer 15.

Further, in the state in which the light emitting device 10*a* is mounted to the mounting substrate 100, the stress applied to the semiconductor layer 15 via the solder 102 can be mitigated by being absorbed by the p-side metal pillar 23 and the n-side metal pillar 24. Instead of the solder 102, a metal or an electrically conductive material other than solder may be used.

A method for manufacturing the light emitting device 10*a* of the embodiment will now be described with reference to FIG. 3A to FIG. 14B. In the drawings illustrating the processes, a region of a portion of the wafer state is illustrated.

FIG. 3A illustrates a stacked body of the first semiconductor layer 11 and the second semiconductor layer 12 formed on a major surface of a substrate 5. FIG. 3B corresponds to a bottom view of FIG. 3A.

The first semiconductor layer 11 is formed on the major surface of the substrate 5. The second semiconductor layer 12 including the light emitting layer 13 is formed on the first semiconductor layer 11. In the case where the first semiconductor layer 11 and the second semiconductor layer 12 are, for example, nitride semiconductors, crystal growth of these may be performed by, for example, MOCVD (metal organic chemical vapor deposition) on a sapphire substrate.

For example, the first semiconductor layer 11 includes a foundation buffer layer and an n-type GaN layer. The second semiconductor layer 12 includes the light emitting layer (the active layer) 13 and a p-type GaN layer. The light emitting layer 13 may be configured to emit blue, violet, bluish-violet, and ultraviolet light, etc.

The surface of the first semiconductor layer 11 contacting the substrate 5 is the first surface 15*a* of the semiconductor layer 15. The surface of the second semiconductor layer 12 is a second surface 15*b* of the semiconductor layer 15.

Then, a trench is formed in dicing regions d1 and d2 as illustrated in FIG. 4A and FIG. 4B which is the bottom view of FIG. 4A by RIE (Reactive Ion Etching) using a not-illustrated resist. The trench is punched through the semiconductor layer 15 and reaches the substrate 5. The dicing regions d1 and d2 are formed, for example, in a lattice configuration on the substrate 5 in the wafer state. The trench in the dicing regions d1 and d2 also is formed in a lattice configuration to separate the semiconductor layer 15 into multiple chips.

The process of separating the semiconductor layer 15 into a plurality may be performed after a selective removal of the second semiconductor layer 12 described below or after forming the electrodes.

Then, a portion of the first semiconductor layer 11 is exposed by removing a portion of the second semiconductor layer 12 as illustrated in FIG. 5A and FIG. 5B which is the bottom view of FIG. 5A by RIE using a not-illustrated resist. The region where the first semiconductor layer 11 is exposed does not include the light emitting layer 13.

Continuing, as illustrated in FIG. 6A and FIG. 6B which is the bottom view of FIG. 6A, the p-side electrode 16 and the n-side electrode 17 are formed on the second surface. The p-side electrode 16 is formed on the surface of the second semiconductor layer 12. The n-side electrode 17 is formed on the exposed surface of the first semiconductor layer 11.

The p-side electrode 16 and the n-side electrode 17 may be formed by, for example, sputtering, vapor deposition, etc. Either the p-side electrode 16 or the n-side electrode 17 may be formed first; or the p-side electrode 16 and the n-side electrode 17 may be formed simultaneously from the same material.

The p-side electrode 16 includes, for example, silver, silver alloy, aluminum, aluminum alloy, etc., that are reflective with respect to the light emitted from the light emitting layer 13. Also, a configuration including a metal protective film to prevent the sulfidization and the oxidization of the p-side electrode 16 may be used.

Further, a silicon nitride film and/or a silicon oxide film, for example, may be formed by CVD (chemical vapor deposition) as a passivation film between the p-side electrode 16 and the n-side electrode 17 and on the end surface (the side surface) of the light emitting layer 13. Activation annealing, etc., to provide an ohmic contact between the semiconductor layer and the electrodes may be implemented if necessary.

Then, as illustrated in FIG. 7A, after covering the entire exposed portion on the major surface of the substrate 5 with the insulating layer 18, the first via 18*a* and the second via 18*b* are made selectively in the insulating layer 18 by patterning the insulating layer 18 using, for example, wet etching. The first via 18*a* reaches the p-side electrode 16. The second via 18*b* reaches the n-side electrode 17.

An organic material, for example, such as photosensitive polyimide, benzocyclobutene, etc., may be used as the insulating layer 18. In such a case, it is possible to directly expose and develop the insulating layer 18 without using a resist. Alternatively, an inorganic film such as a silicon nitride film, a silicon oxide film, etc., may be used as the insulating layer 18. In the case of the inorganic film, the desired configuration is obtained by etching after the resist is patterned.

Then, as illustrated in FIG. 7B, a seed metal 19 is formed on the interconnect surface 18*c* of the insulating layer 18 which is the surface on the side opposite to the semiconductor layer 15. The seed metal 19 may be formed also on the inner wall and the bottom portion of the first via 18*a* and the inner wall and the bottom portion of the second via 18*b*.

The seed metal 19 may be formed using, for example, sputtering. The seed metal 19 includes, for example, a stacked film of titanium (Ti) and copper (Cu) stacked in order from the insulating layer 18 side.

Then, as illustrated in FIG. 7C, a resist 41 is formed selectively on the seed metal 19; and Cu electroplating is performed using the seed metal 19 as a current path.

Thereby, as illustrated in FIG. 8A and FIG. 8B which is the bottom view of FIG. 8A, the p-side metal plate layer 21 and the n-side metal plate layer 22 are formed selectively on the interconnect surface 18*c* of the insulating layer 18. The p-side metal plate layer 21 and the n-side metal plate layer 22 are made of, for example, a copper material formed simultaneously by plating.

The p-side metal plate layer 21 is formed also inside the first via 18*a* and is electrically connected to the p-side electrode 16 via the seed metal 19. The n-side metal plate layer 22 is formed also inside the second via 18*b* and is electrically connected to the n-side electrode 17 via the seed metal 19.

Here, the dicing region d2 extends in a direction (the lateral direction of FIG. 8B) along the side surface 21*a* of the p-side metal plate layer 21 and the side surface 22*a* of the n-side metal plate layer 22 exposed at the third surface described above. Also, the side surface 21*a* and the side surface 22*a* jut onto the dicing region d2.

Single dot-dash lines e1 and e2 of FIG. 8B illustrate two edges of a dicing blade respectively.

A notch 21b is made in a portion of the p-side metal plate layer 21 which is on the n-side metal plate layer 22 side and on the side surface 21a side. The notch 21b exists between the side surface 21a and the side surface 22a. Therefore, the separation distance between the side surface 21a and the side surface 22a exposed to the outside after the dicing can be a distance sufficient to avoid shorts due to the solder, etc., when mounting.

In the portion where the notch 21b is not made, the p-side metal plate layer 21 can be proximal to the n-side metal plate layer 22 up to the process limitations; and the surface area of the p-side metal plate layer 21 can be wide. As a result, the p-side metal plate layer 21 and the p-side electrode 16 can be connected through multiple first vias 18a; and the current distribution and the heat dissipation can be improved.

The side surface 21a and the side surface 22a exist on both width-direction sides of the dicing region d2 without existing with a bias toward one width-direction side of the dicing region d2. In other words, the side surface 21a and the side surface 22a which are each metal do not exist with a bias toward the side of one width direction-edge of the dicing blade. Therefore, the occurrence of clogging, damage, etc., due to an excessive load on one width direction-edge of the dicing blade during the dicing can be suppressed.

Although the side surface 21a and the side surface 22a that exist on the edge e1 side and the side surface 21a and the side surface 22a that exist on the edge e2 side are arranged alternately as viewed in the direction in which the dicing region d2 extends in FIG. 8B, this is not limited to such a layout. It is sufficient for the side surface 21a and the side surface 22a not to exist with a bias toward the side of one selected from the edge e1 and the edge e2.

The resist 41 used for the plating of the p-side metal plate layer 21 and the n-side metal plate layer 22 is removed using a solvent or oxygen plasma (FIG. 9A).

Then, as illustrated in FIG. 9B, a resist 42 for forming the metal pillars is formed. The resist 42 is thicker than the resist 41 described above. The resist 41 of the previous processes may remain without being removed; and the resist 42 may be formed to overlap the resist 41.

Continuing, using the resist 42 as a mask, Cu electroplating is performed using the seed metal 19 as a current path. Thereby, as illustrated in FIG. 10A and FIG. 10B which is the bottom view of FIG. 10A, the p-side metal pillar 23 and the n-side metal pillar 24 are formed.

The p-side metal pillar 23 is formed inside an opening 42a made in the resist 42 and on the surface of the p-side metal plate layer 21. The n-side metal pillar 24 is formed inside an opening 42b made in the resist 42 and on the surface of the n-side metal plate layer 22. The p-side metal pillar 23 and the n-side metal pillar 24 are made of, for example, a copper material formed simultaneously by plating.

The p-side external terminal 23a of the p-side metal pillar 23 and the n-side external terminal 24a of the n-side metal pillar 24 that are exposed at the third surface described above after the dicing jut onto the dicing region d2 extending in the direction along the third surface.

Figures 10A, 10B:
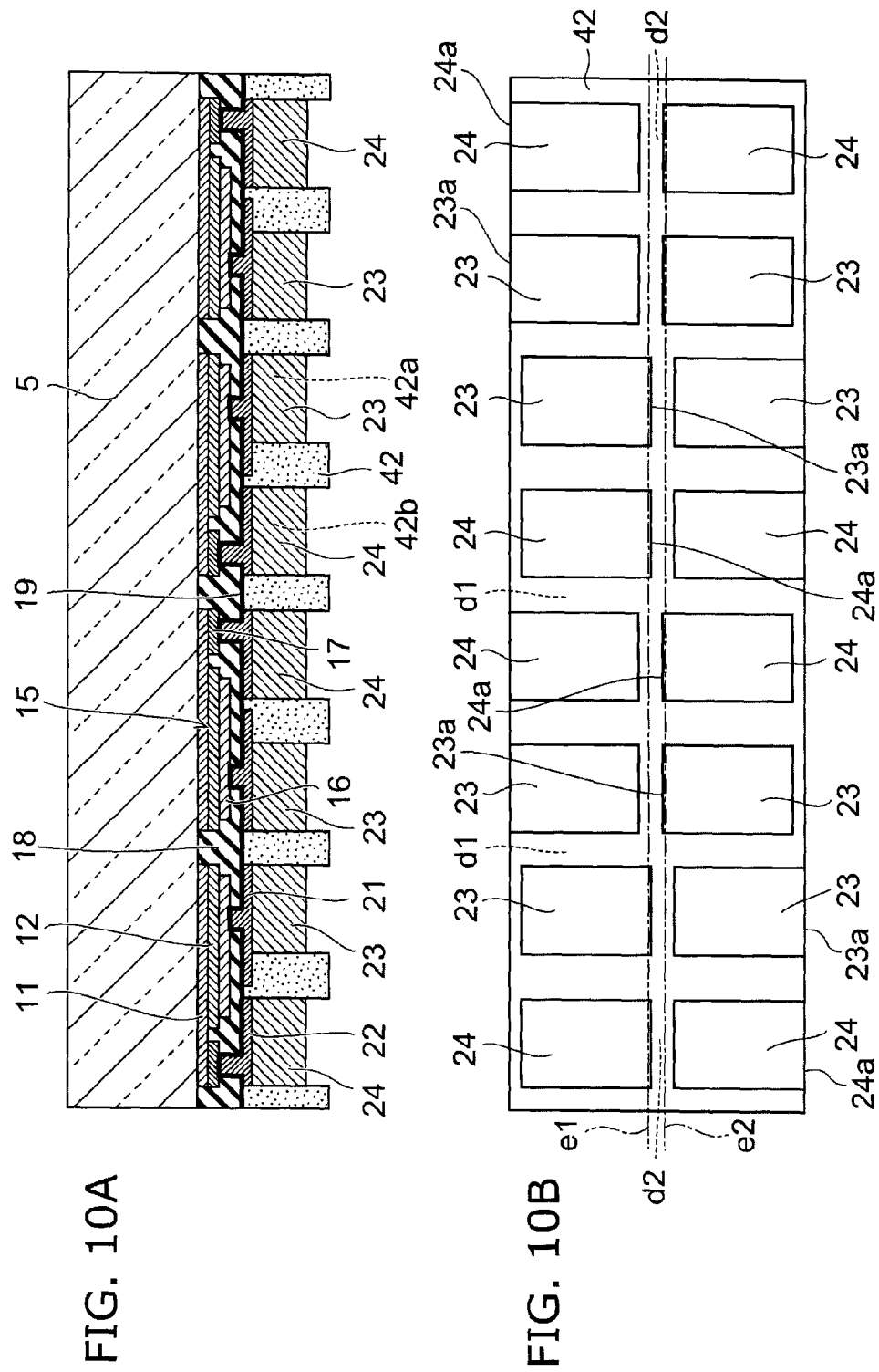

The single dot-dash lines e1 and e2 of FIG. 10B illustrate two edges of the dicing blade respectively.

The p-side external terminal 23a and the n-side external terminal 24a exist on both width-direction sides of the dicing region d2 without existing with a bias toward one width-direction side of the dicing region d2. In other words, the p-side external terminal 23a and the n-side external terminal 24a which are each metal exist without a bias toward the side of one width direction-edge of the dicing blade. Therefore, the occurrence of clogging, damage, etc., due to an excessive load on one width direction-edge of the dicing blade during the dicing can be suppressed.

Although the p-side external terminal 23a and the n-side external terminal 24a that exist on the edge e1 side and the p-side external terminal 23a and the n-side external terminal 24a that exist on the edge e2 side are arranged alternately as viewed in the direction in which the dicing region d2 extends in FIG. 10B, this is not limited to such a layout. It is sufficient for the p-side external terminal 23a and the n-side external terminal 24a not to exist with a bias toward the side of one selected from the edge e1 and the edge e2.

Figure 11A:
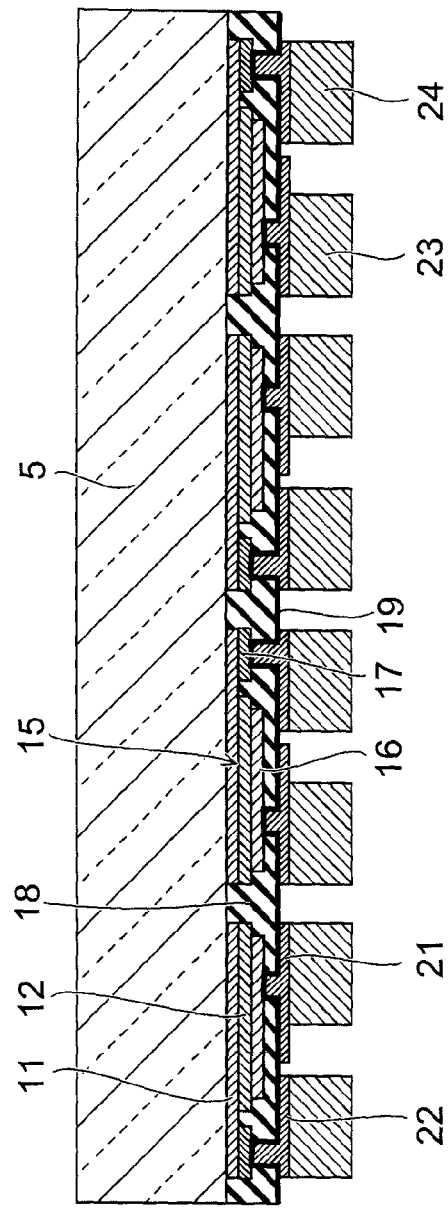
Figure 11B:
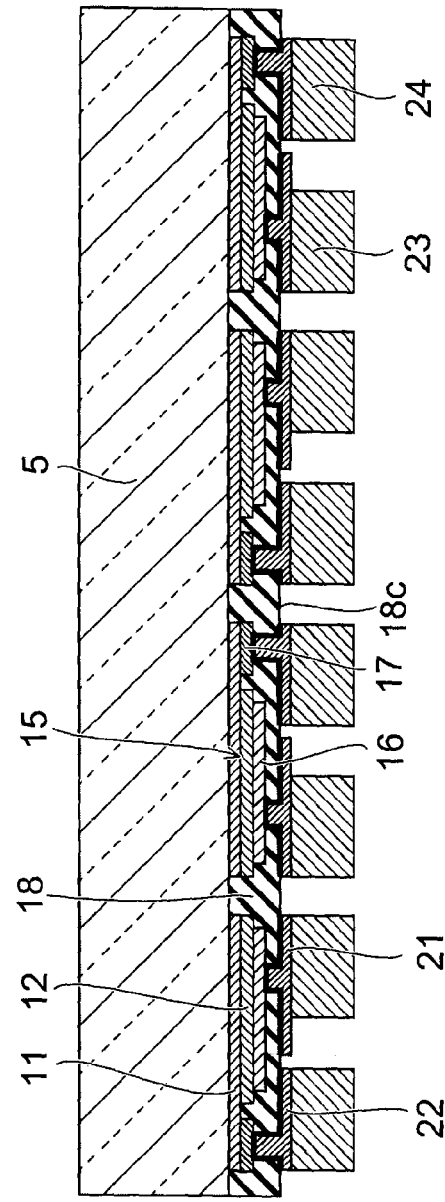

Then, the resist 42 is removed using, for example, a solvent or oxygen plasma (FIG. 11A). Subsequently, the exposed portion of the seed metal 19 is removed by wet etching using the p-side metal pillar 23, the n-side metal pillar 24, and a portion of the p-side metal plate layer 21 jutting from the p-side metal pillar 23 as a mask. Thereby, as illustrated in FIG. 11B, the electrical connection between the p-side metal plate layer 21 and the n-side metal plate layer 22 via the seed metal 19 is divided.

Figures 12A, 12B:
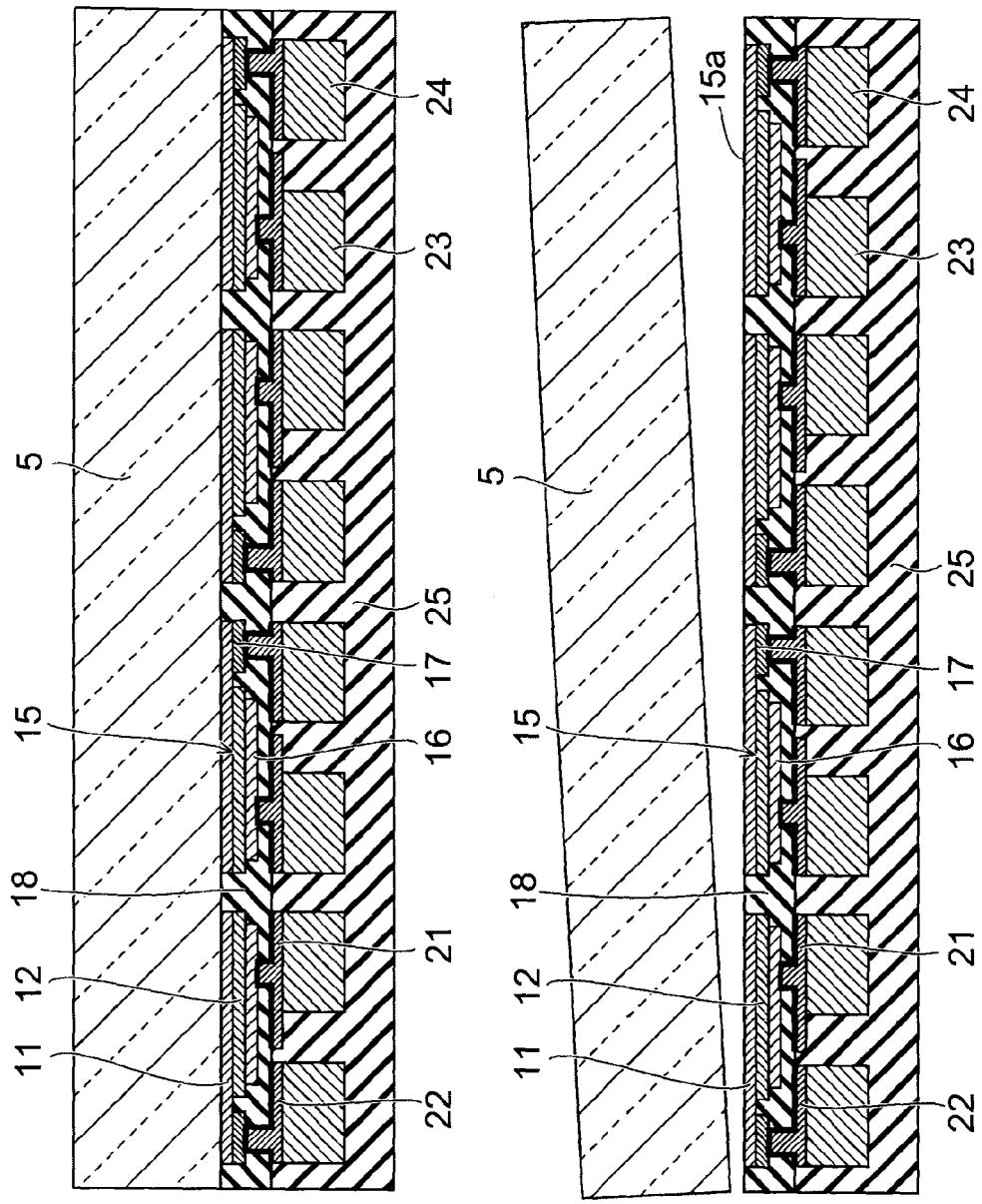

Continuing as illustrated in FIG. 12A, the resin layer 25 is stacked on the insulating layer 18. The resin layer 25 covers the p-side metal plate layer 21, the n-side metal plate layer 22, the p-side metal pillar 23, and the n-side metal pillar 24.

The resin layer 25 is insulative. Further, the resin layer may contain, for example, carbon black to make it light-shielding with respect to the light emitted from the light emitting layer. Also, the resin layer 25 may contain a powder that is reflective with respect to the light emitted from the light emitting layer.

Then, as illustrated in FIG. 12B, the substrate 5 is removed. The substrate 5 may be removed using, for example, laser lift-off. Specifically, laser light is irradiated from the back surface side of the substrate 5 toward the first semiconductor layer 11. The laser light has a wavelength that is transmissive with respect to the substrate 5 and in the absorption region of the first semiconductor layer 11.

When the laser light reaches the interface between the substrate 5 and the first semiconductor layer 11, the first semiconductor layer 11 proximal to the interface decomposes by absorbing the energy of the laser light. For example, in the case where the first semiconductor layer 11 is GaN, the first semiconductor layer 11 decomposes into gallium (Ga) and nitrogen gas. By this decomposition reaction, a micro gap is formed between the substrate 5 and the first semiconductor layer 11; and the substrate 5 and the first semiconductor layer 11 separate.

The irradiation of the laser light is performed over the entire wafer by performing multiply for every set region; and the substrate 5 is removed.

Because the stacked body described above formed on the major surface of the substrate 5 is reinforced by the thick resin layer 25, it is possible to maintain the wafer state even in the case where there is no substrate 5. Also, the resin layer 25 and the metal included in the metal plate layers and the metal pillars are materials softer than the semiconductor layer 15. Therefore, destruction of the device can be avoided even in the case where the large internal stress generated in the epitaxial process that forms the semiconductor layer 15 on the substrate 5 is released all at once when peeling the substrate 5.

The first surface 15a of the semiconductor layer 15 from which the substrate 5 is removed is cleaned. The gallium (Ga) adhered to the first surface 15a is removed using, for example, hydrochloric acid, etc.

Further, the first surface 15a is etched using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation (FIG. 13A). Alternatively, the unevenness may be formed in the first surface 15a by performing the etching after the patterning using the resist. The light extraction efficiency can be increased by the unevenness being formed in the first surface 15a.

Then, as illustrated in FIG. 13B, the lens 26 is formed on the first surface 15a. The lens 26 is transparent to the emitted light from the light emitting layer; and, for example, a silicone resin, an acrylic resin, glass, etc., may be used. The lens 26 can be formed by, for example, etching using a grayscale mask and/or imprinting.

Continuing, the phosphor layer 27 is formed on the first surface 15a and on the insulating layer 18 exposed between the mutually-adjacent semiconductor layer 15 to cover the lens 26. For example, a liquid transparent resin having dispersed phosphor particles is supplied using a method such as printing, potting, molding, compression molding, etc., and is subsequently thermally cured. The transparent resin is transmissive to the light emitted from the light emitting layer and the light emitted by the phosphor; and, for example, a material such as a silicone resin, an acrylic resin, liquid glass, etc., may be used.

Then, as illustrated in FIGS. 14A and 14B, the phosphor layer 27, the insulating layer 18, and the resin layer 25 are cut at the positions where the dicing regions d1 and d2 are formed in the lattice configuration to singulate into the multiple light emitting devices 10a. For example, the cutting is performed using a dicing blade. Alternatively, the cutting may be performed using laser irradiation.

At this time, the portions of the p-side metal pillar 23 and the n-side metal pillar 24 jutting into the dicing region d2 extending in the direction along the third surface 30 are cut. Thereby, the p-side external terminal 23a and the n-side external terminal 24a are exposed at the third surface 30.

Similarly, the portions of the p-side metal plate layer 21 and the n-side metal plate layer 22 jutting into the dicing region d2 are cut (FIG. 8B). Thereby, the side surface 21a of the p-side metal plate layer 21 and the side surface 22a of the n-side metal plate layer 22 also are exposed at the third surface 30.

When dicing, the substrate 5 is already removed. Further, damage to the semiconductor layer 15 during the dicing can be avoided because the semiconductor layer 15 does not exist in the dicing regions d1 and d2. Also, a structure is obtained in which the end portion (the side surface) of the semiconductor layer 15 is protected by being covered with the resin after the singulation.

The singulated light emitting device 10a may have a single-chip structure including one semiconductor layer 15 or a multi-chip structure including multiple semiconductor layers 15.

It is unnecessary to perform the interconnect and the packaging for every singulated individual device and it becomes possible to drastically reduce the production costs because each of the processes described above up to prior to the dicing is performed collectively in the wafer state. In other words, the interconnect and the packaging are already completed in the singulated state. Therefore, the productivity can be increased; and as a result, price reductions become easy.

Figure 15A:
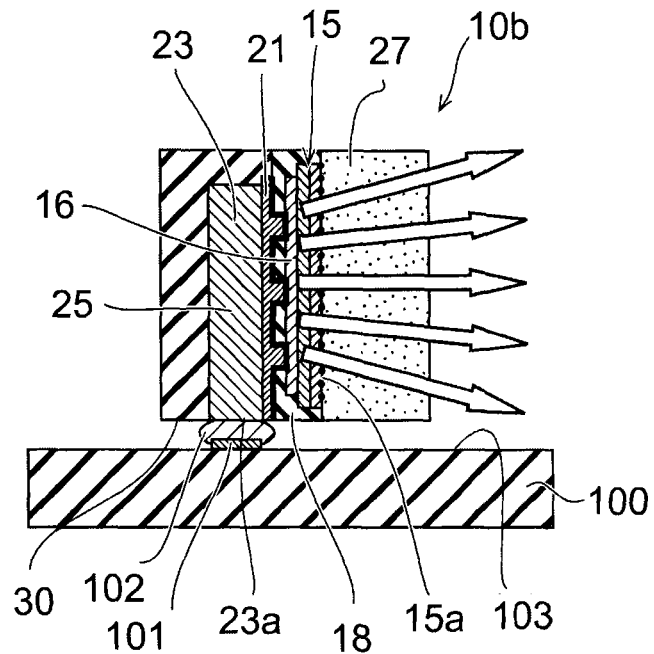

A structure may be used in which a lens is not provided on the first surface 15a side as in a light emitting device 10b illustrated in FIG. 15A.

Figure 15B:
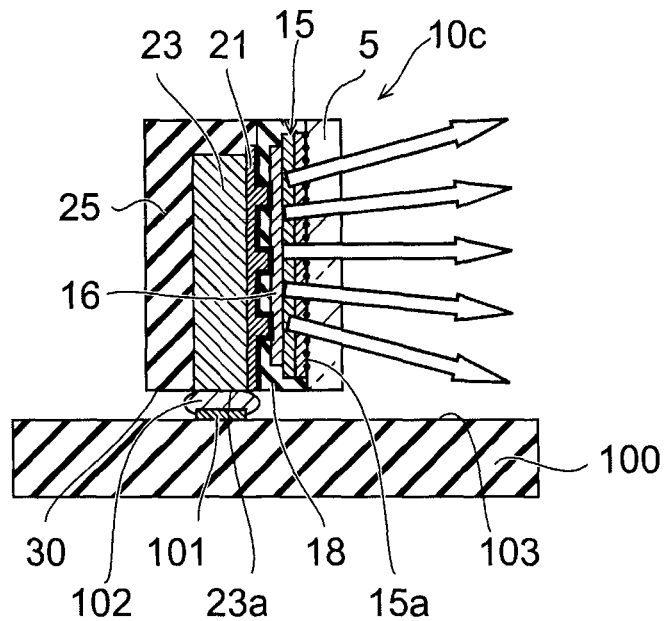

Further, the substrate 5 may thinly remain on the first surface 15a as in a light emitting device 10c illustrated in FIG. 15B. For example, the substrate 5 can be polished using a grinder for polishing a semiconductor wafer back surface, etc.

The substrate 5 is, for example, a sapphire substrate and is transmissive to the light emitted from the nitride semiconductor-type light emitting layer. In such a case, because there is no phosphor layer, light having the same wavelength as the emitted light from the light emitting layer is emitted to the outside from the light emitting device 10c. Of course, a phosphor layer may be formed on the substrate 5.

The mechanical strength can be increased and a structure having high reliability is possible by leaving the substrate 5.

When dicing, a half-cut can be made using a dicing blade from the resin layer 25 side; and subsequently, the substrate 5 can be subdivided using laser irradiation. Alternatively, all portions may be cut using laser irradiation.

Second Embodiment

Figure 16A:
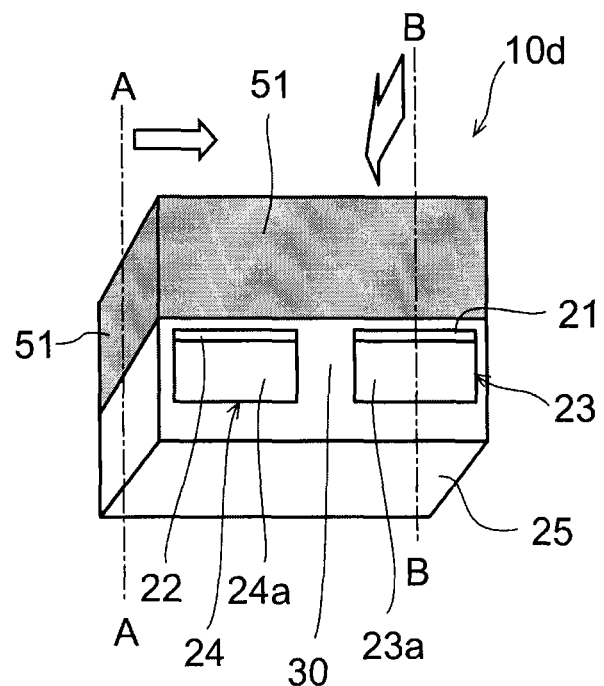
FIGS. 16A and 16B are schematic perspective views of a light emitting device of a second embodiment.

FIG. 16A is a schematic perspective view as viewed from the third surface 30 side of a light emitting device 10d of a second embodiment.

Figure 16B:
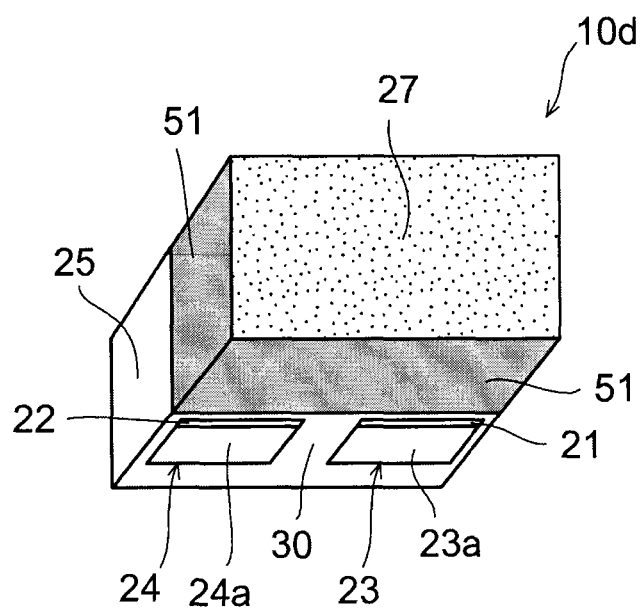

FIG. 16B is a schematic perspective view as viewed from the light emitting surface side of the light emitting device 10d.

Figure 17A:
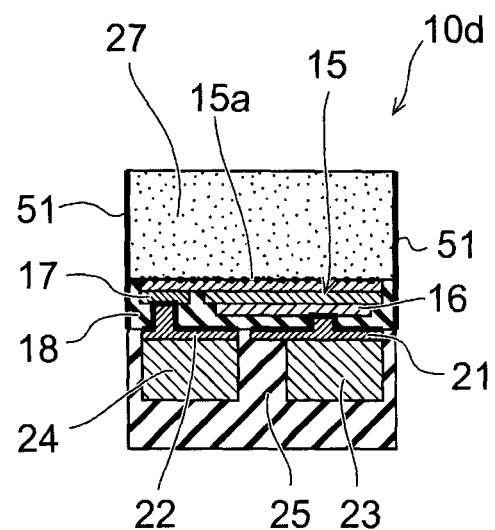
FIGS. 17A and 17B are schematic cross-sectional views of the light emitting device of the second embodiment.

FIG. 17A is an A-A cross-sectional view of FIG. 16A.

Figure 17B:
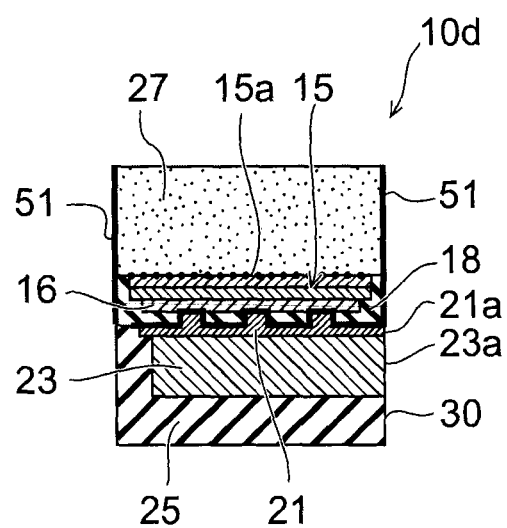

FIG. 17B is a B-B cross-sectional view of FIG. 16A.

The light emitting device 10d of the embodiment is different from the light emitting device 10a of the first embodiment in that a reflective film 51 is included.

The reflective film 51 is reflective with respect to the light emitted from the light emitting layer and the light emitted by the phosphor. The reflective film 51 is, for example, a metal film. The reflective film 51 is formed on the side surface of the phosphor layer 27 and the side surface of the insulating layer 18. The reflective film 51 is not formed on the surface of the phosphor layer 27 on the side opposite to the first surface 15a.

Figure 18:
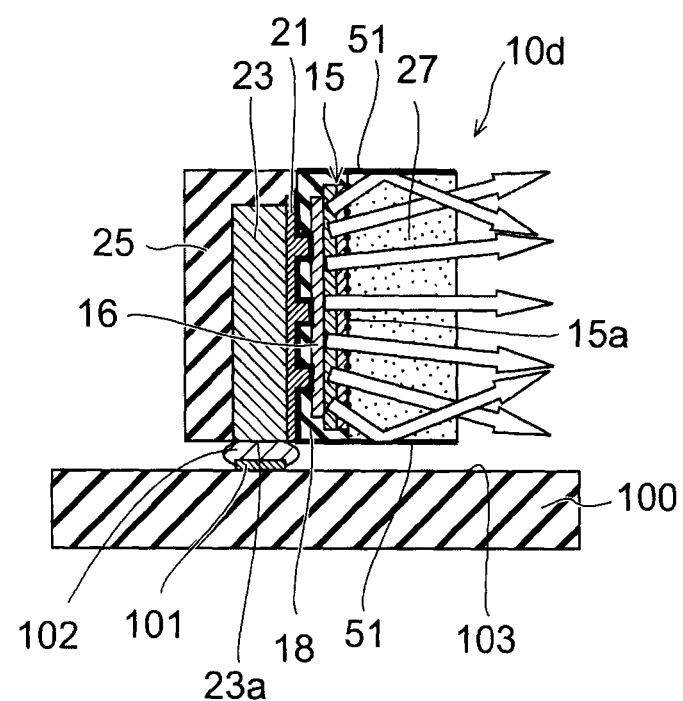
FIG. 18 is a schematic cross-sectional view of a light emitting module of the second embodiment.

FIG. 18 is a schematic cross-sectional view of a light emitting module having a configuration in which the light emitting device 10d of the embodiment is mounted on the mounting substrate 100.

Similarly to the first embodiment, the light emitting device 10d is mounted with an attitude in which the third surface 30 is oriented toward the mounting surface 103 of the mounting substrate 100. Each of the p-side external terminal 23a and the n-side external terminal 24a exposed at the third surface 30 is bonded with the solder 102, etc., to the pad 101 formed in the mounting surface 103.

The third surface 30 is substantially perpendicular to the first surface 15a which is the main emitting surface of the light. Accordingly, the first surface 15a is oriented not upward from the mounting surface 103 but in the lateral direction with an attitude in which the third surface 30 is oriented downward toward the mounting surface 103 side. In other words, a so-called side-view type light emitting device 10d and light emitting module are obtained in which the light is emitted in the lateral direction in the case where the mounting surface 103 is a horizontal surface.

Because the side surfaces of the insulating layer 18 and the phosphor layer 27 are covered with the reflective film 51, the light is emitted by being concentrated in the lateral direction.

A method for manufacturing the light emitting device 10d of the embodiment will now be described with reference to FIG. 19A to FIG. 21B.

Figure 19A:
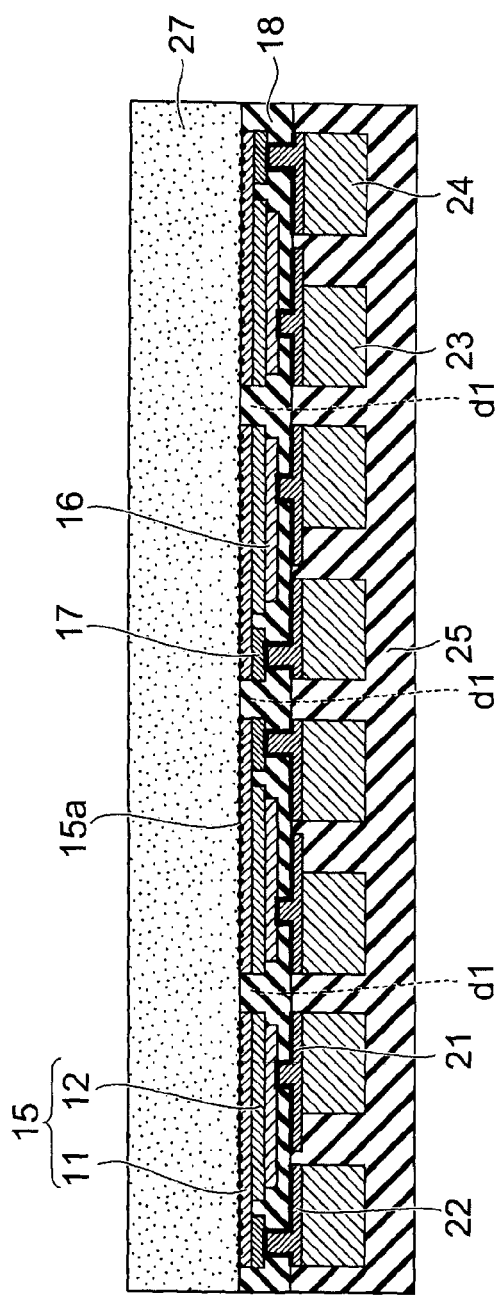
Figure 19B:
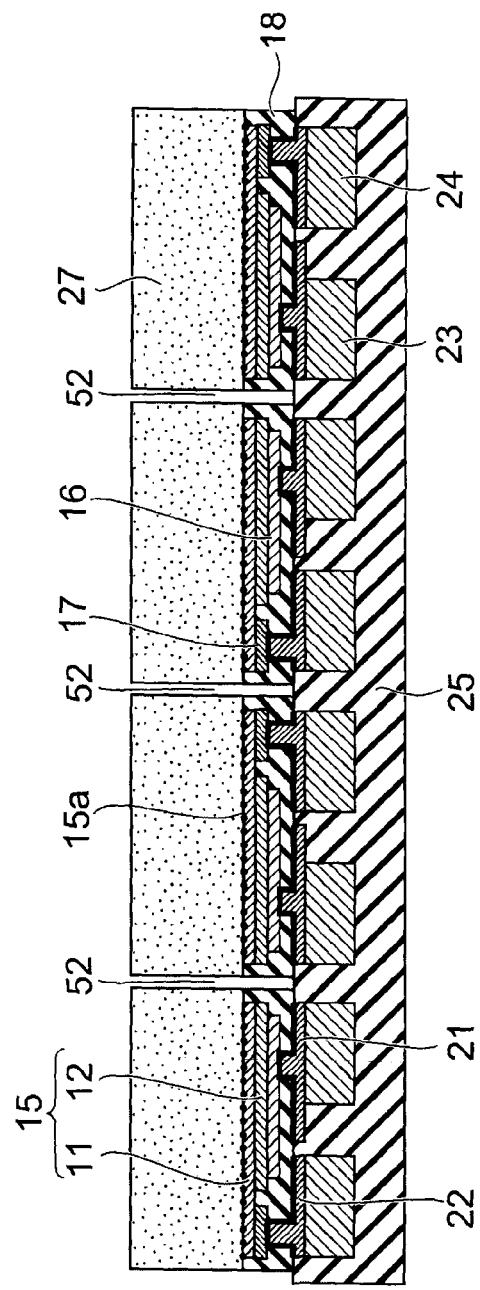

FIG. 19A illustrates the state in which the substrate 5 is removed and the phosphor layer 27 is formed on the first surface 15a. Up to this process, the processes progress similarly to those of the first embodiment described above.

Then, half-cut dicing is performed on the stacked body illustrated in FIG. 19A from the phosphor layer 27 side. Specifically, the phosphor layer 27 and the insulating layer 18 are cut at the positions of the dicing regions d1 and d2. For example, the cutting is performed using a dicing blade or laser irradiation. Thereby, a trench 52 (FIG. 19B) is made in the dicing regions d1 and d2.

Continuing, the reflective film 51 is formed by, for example, performing sputtering onto the exposed surface. As illustrated in FIG. 20A, the reflective film 51 is formed on the upper surface of the phosphor layer 27 and the bottom portion and the inner wall of the trench 52.

For example, silver, aluminum, gold, silicon, a dielectric multiple-layer film, etc., can be used as the reflective film 51. Alternatively, a resin including a reflective powder may be used as the reflective film 51.

Then, as illustrated in FIG. 20B, the reflective film 51 formed on the upper surface of the phosphor layer 27 is removed by polishing. For example, a grinder for polishing a semiconductor wafer back surface, etc., can be used. Alternatively, the reflective film 51 formed on the upper surface of the phosphor layer 27 may be removed using RIE. The reflective film 51 remains on the side surface of the phosphor layer 27 and the side surface of the insulating layer 18.

Figures 21A, 21B:
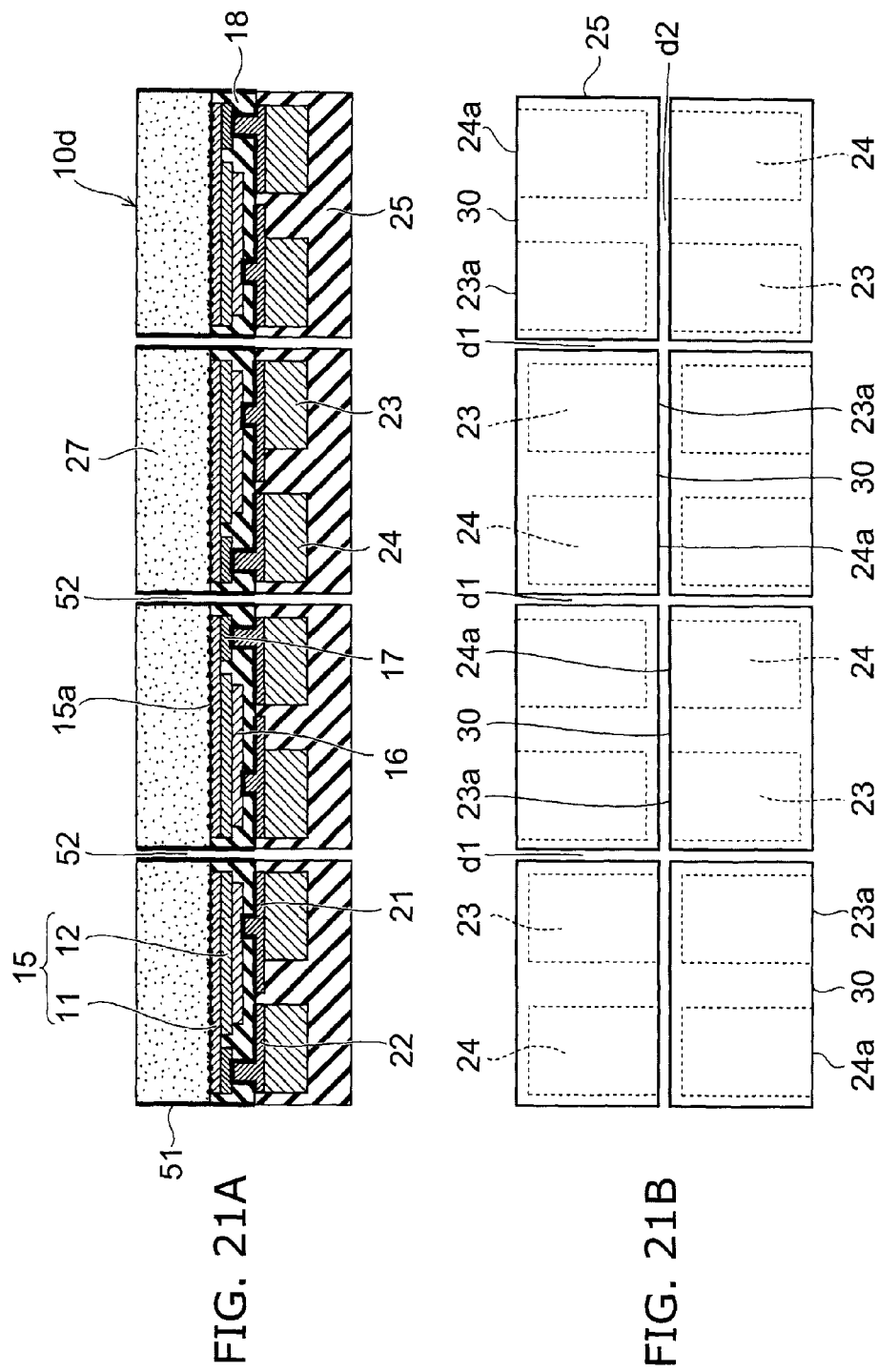

Continuing, the resin layer 25 under the trench 52 is cut (FIGS. 21A and 21B). The cutting is performed using, for example, a dicing blade. Alternatively, the cutting may be performed using laser irradiation. Thereby, singulation is performed into the multiple light emitting devices 10d.

At this time as well, similarly to the first embodiment, the portions of the p-side metal pillar 23 and the n-side metal pillar 24 jutting into the dicing region d2 extending in the direction along the third surface 30 are cut. Thereby, the p-side external terminal 23a and the n-side external terminal 24a are exposed at the third surface 30.

In the embodiment as well, the dicing can be easy and the productivity can be increased because the resin is cut. Further, because the semiconductor layer 15 is not cut, the damage to the semiconductor layer 15 during the dicing can be avoided.

Third Embodiment

Figure 22A:
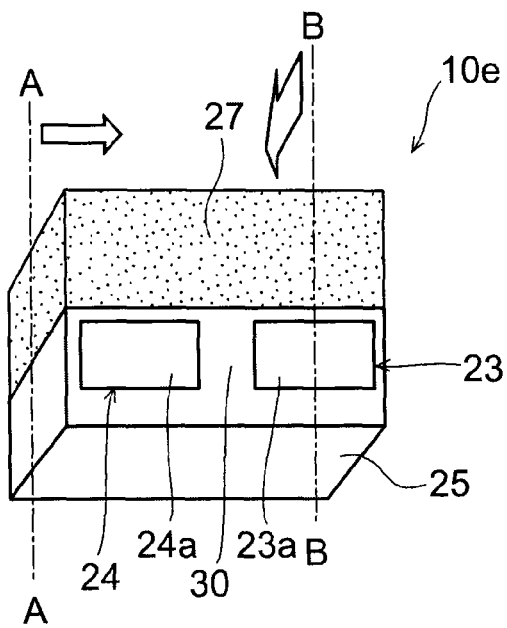
FIGS. 22A to 22C are schematic views of a light emitting device of a third embodiment.
Figure 22B:
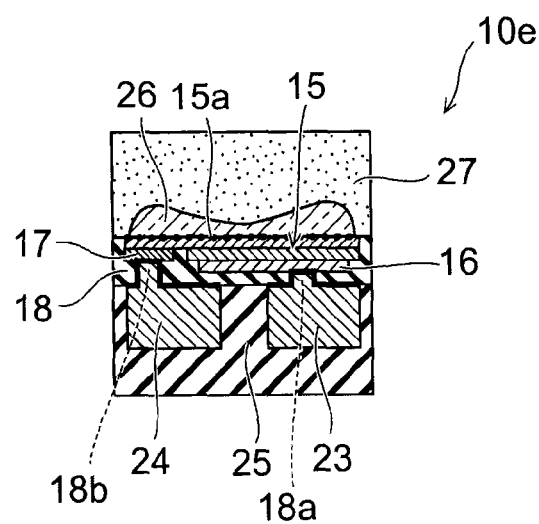
Figure 22C:
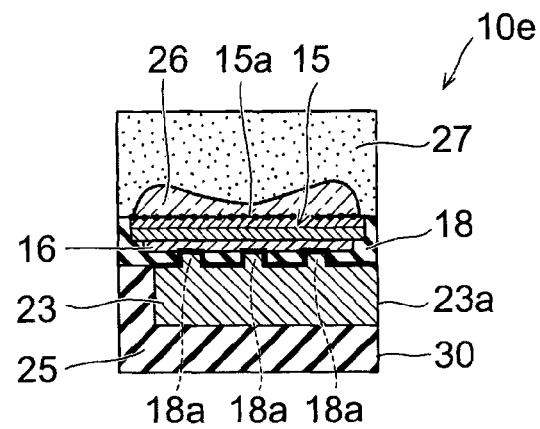

FIG. 22A is a schematic perspective view of a light emitting device 10e of a third embodiment. FIG. 22B is an A-A cross-sectional view of FIG. 22A. FIG. 22C is a B-B cross-sectional view of FIG. 22A.

In the light emitting device 10e of the embodiment, a portion of the p-side metal pillar 23 is provided inside the first via 18a without the p-side metal plate layer being provided. Further, a portion of the n-side metal pillar 24 is provided inside the second via 18b without the n-side metal plate layer being provided.

By the p-side metal plate layer and the n-side metal plate layer not being provided, process reductions are possible and cost reductions are possible.

Figure 23:
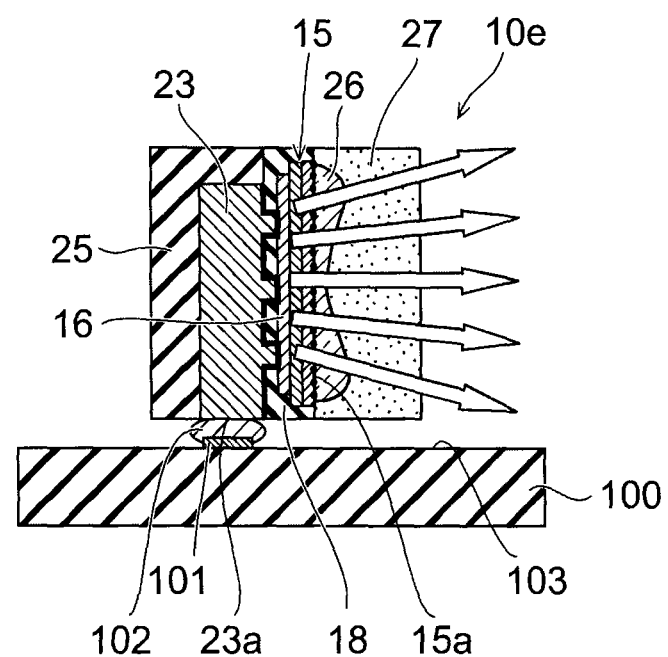
FIG. 23 is a schematic cross-sectional view of a light emitting module of the third embodiment.

FIG. 23 is a schematic cross-sectional view of a light emitting module having a configuration in which the light emitting device 10e of the embodiment is mounted on the mounting substrate 100.

In the embodiment as well, the light emitting device 10e is mounted with an attitude in which the third surface 30 is oriented toward the mounting surface 103 of the mounting substrate 100. Then, each of the p-side external terminal 23a and the n-side external terminal 24a exposed at the third surface 30 is bonded with the solder 102, etc., to the pad 101 formed in the mounting surface 103.

The third surface 30 is substantially perpendicular to the first surface 15a which is the main emitting surface of the light. Accordingly, the first surface 15a is oriented not upward from the mounting surface 103 but in the lateral direction with an attitude in which the third surface 30 is oriented downward toward the mounting surface 103 side. In other words, a so-called side-view type light emitting device 10e and light emitting module are obtained in which the light is emitted in the lateral direction in the case where the mounting surface 103 is a horizontal surface.

A method for manufacturing the light emitting device 10e of the embodiment will now be described with reference to FIG. 24A to FIG. 29B.

As illustrated in FIG. 24A, up to the process of forming the seed metal 19, the processes progress similarly to those of the first embodiment.

Then, as illustrated in FIG. 24B, the resist 42 is formed selectively on the seed metal 19; and Cu electroplating is performed using the seed metal 19 as a current path.

Figures 25A, 25B:
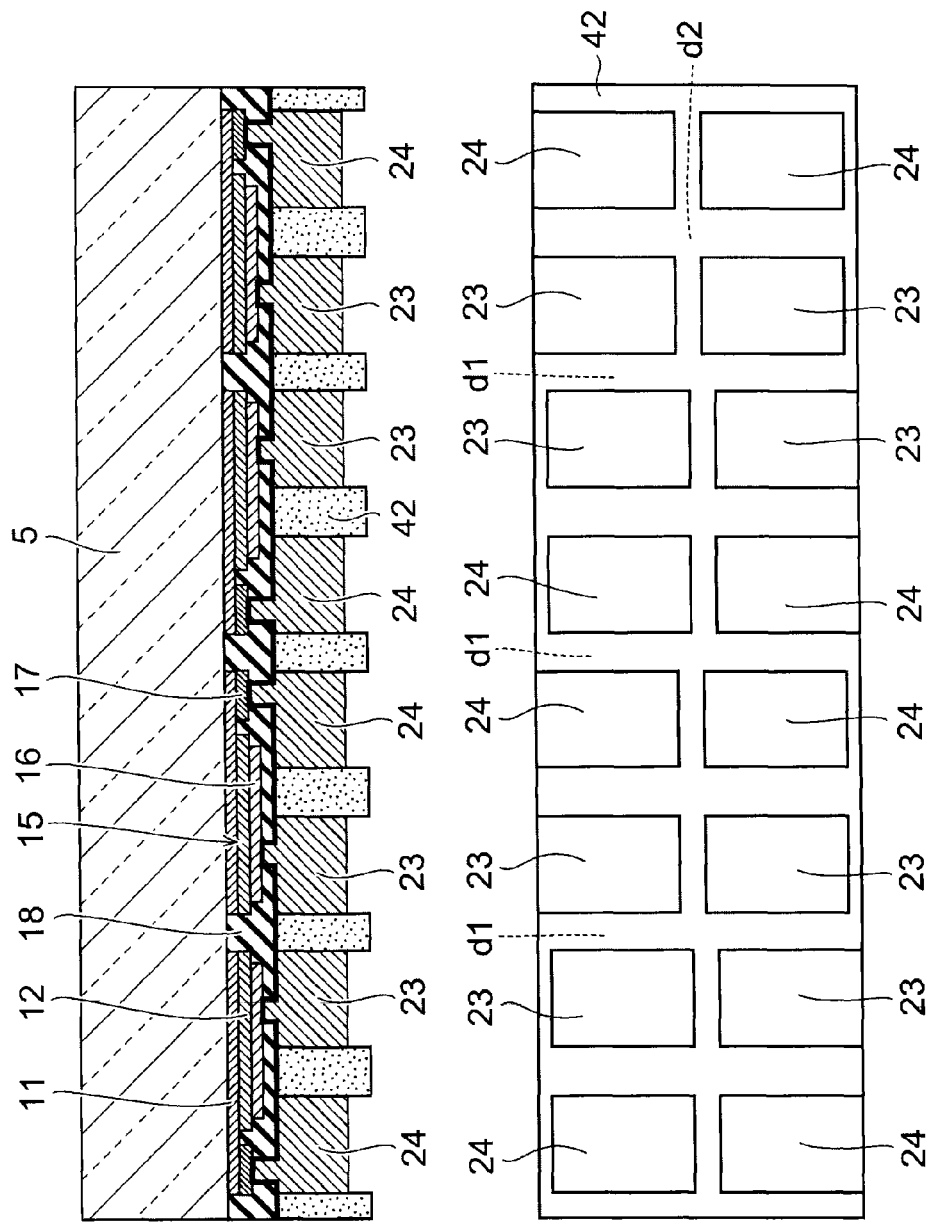

Thereby, as illustrated in FIG. 25A and FIG. 25B which is the bottom view of FIG. 25A, the p-side metal pillar 23 and the n-side metal pillar 24 are formed on the interconnect surface 18c of the insulating layer 18.

A portion of the p-side metal pillar 23 is formed also inside the first via 18a and is electrically connected to the p-side electrode 16 via the seed metal 19. A portion of the n-side metal pillar 24 is formed also inside the second via 18b and is electrically connected to the n-side electrode 17 via the seed metal 19.

In the embodiment as well, the p-side external terminal 23a of the p-side metal pillar 23 and the n-side external terminal 24a of the n-side metal pillar 24 exposed at the third surface after the dicing, jut onto the dicing region d2 extending in the direction along the third surface.

Then, the resist 42 is removed using, for example, a solvent or oxygen plasma (FIG. 26A). Subsequently, the exposed portion of the seed metal 19 is removed by wet etching using the p-side metal pillar 23 and the n-side metal pillar 24 as a mask. Thereby, as illustrated in FIG. 26B, the electrical connection between the p-side metal pillar 23 and the n-side metal pillar 24 via the seed metal 19 is broken.

Figures 27A, 27B:
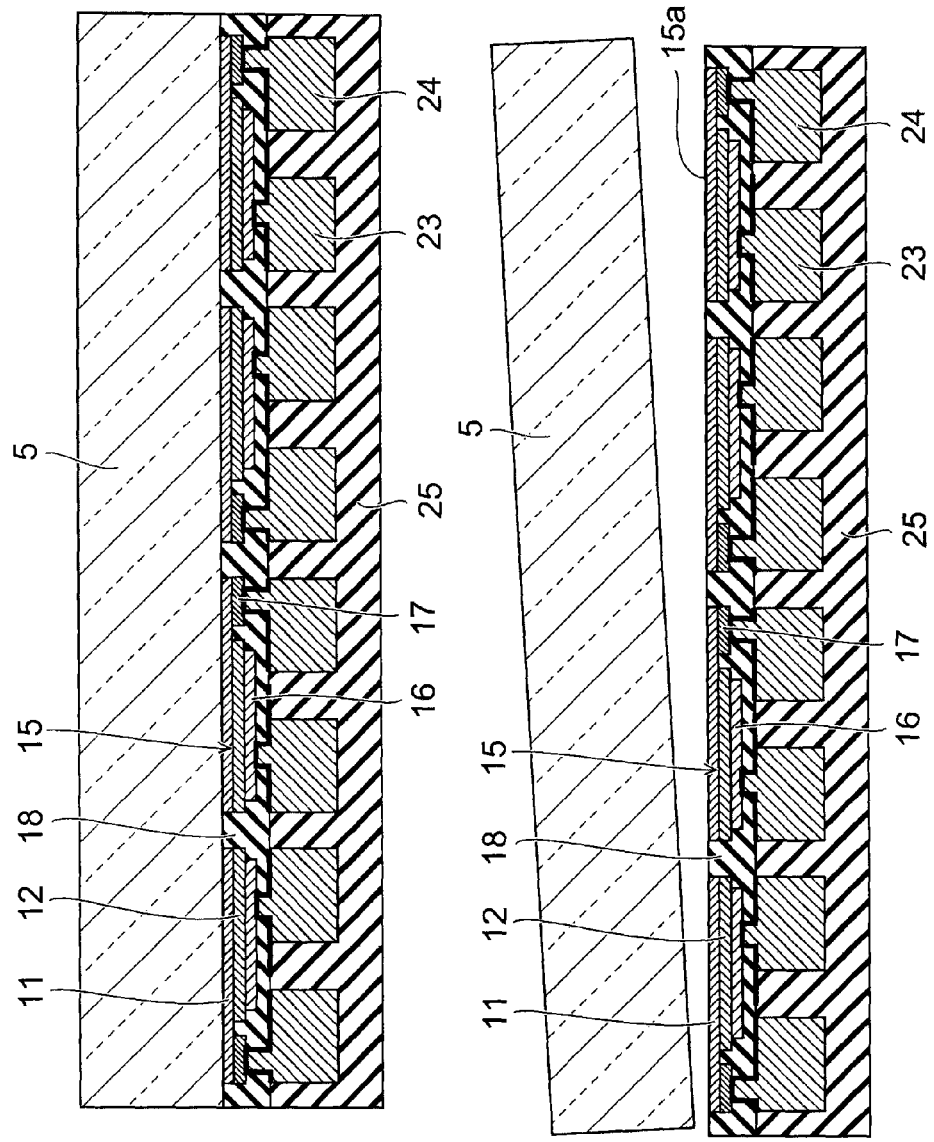

Continuing as illustrated in FIG. 27A, the resin layer 25 is stacked on the insulating layer 18. The resin layer 25 covers the p-side metal pillar 23 and the n-side metal pillar 24.

Then, as illustrated in FIG. 27B, the substrate 5 is removed. The substrate 5 is removed using, for example, laser lift-off.

Continuing, after the first surface 15a is cleaned, an unevenness is formed in the first surface 15a by etching the first surface 15a using, for example, a KOH (potassium hydroxide) aqueous solution, TMAH (tetramethylammonium hydroxide), etc. (FIG. 28A).

Figures 28A, 28B:
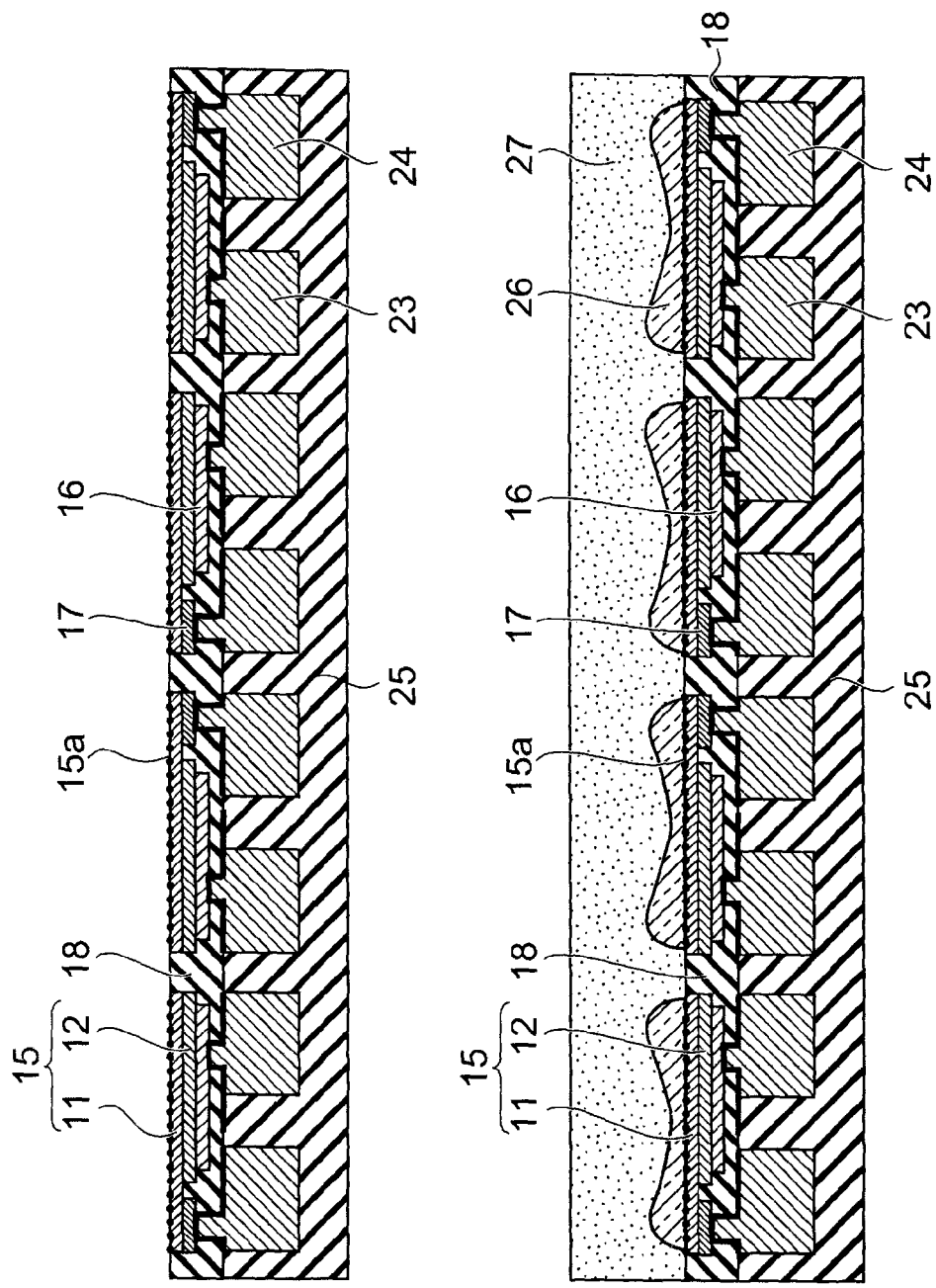

Then, as illustrated in FIG. 28B, the lens 26 is formed on the first surface 15a. Further, the phosphor layer 27 is formed on the first surface 15a and on the insulating layer 18 exposed between the mutually-adjacent semiconductor layer 15 to cover the lens 26.

Figure 29A:
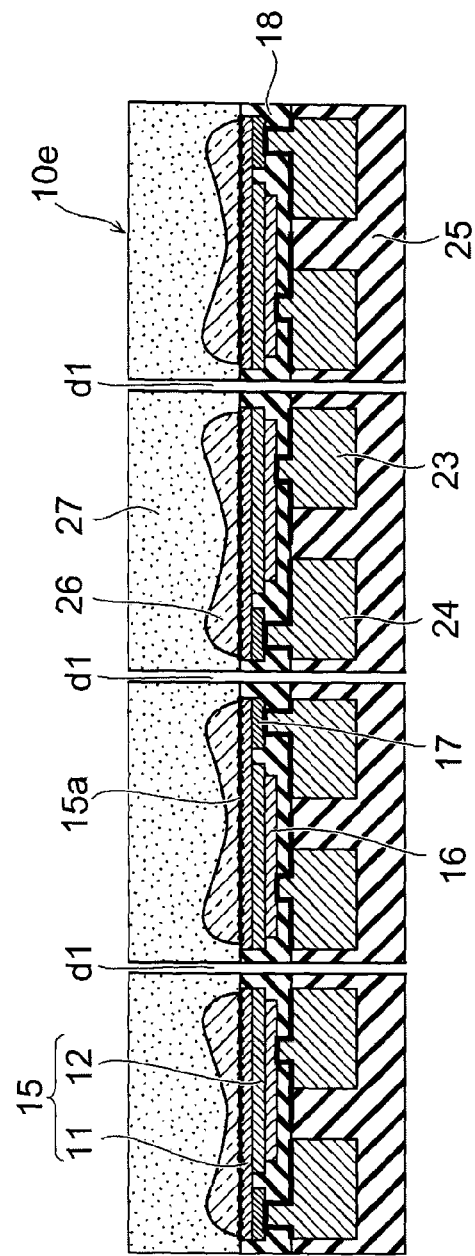
Figure 29B:
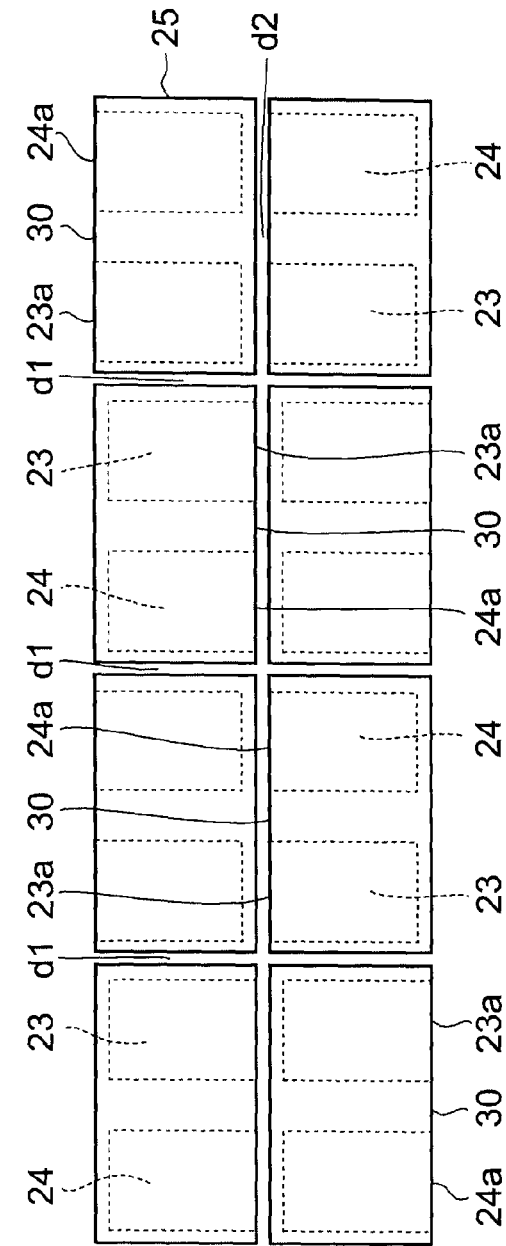

Continuing as illustrated in FIGS. 29A and 29B, the phosphor layer 27, the insulating layer 18, and the resin layer 25 are cut at the positions of the dicing regions d1 and d2 formed in the lattice configuration to singulate into the multiple light emitting devices 10e.

At this time, the portions of the p-side metal pillar 23 and the n-side metal pillar 24 jutting into the dicing region d2 extending in the direction along the third surface 30 are cut.

Thereby, the p-side external terminal 23a and the n-side external terminal 24a are exposed at the third surface 30.

Fourth Embodiment

Figure 30A:
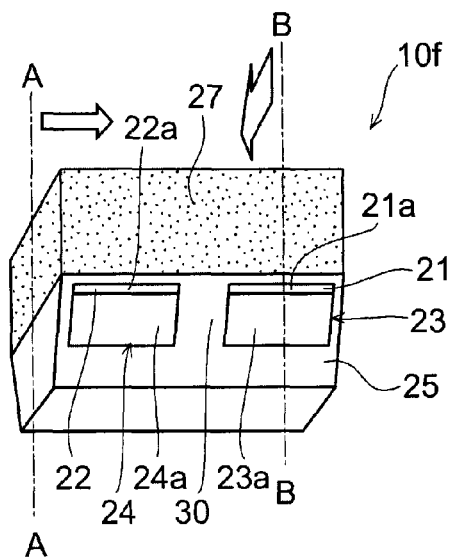
FIGS. 30A to 30C are schematic views of a light emitting device of a fourth embodiment.
Figure 30B:
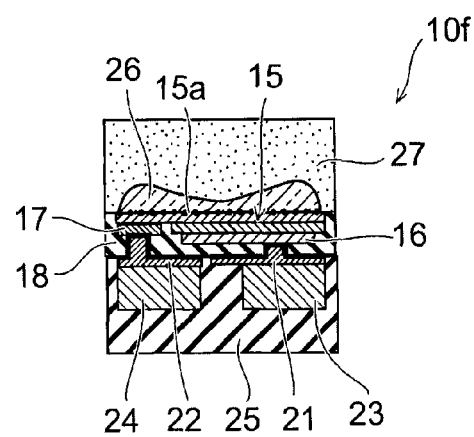
Figure 30C:
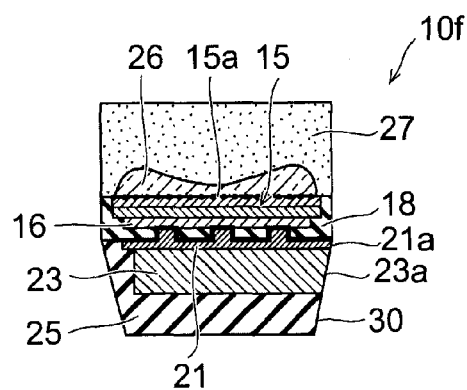

FIG. 30A is a schematic perspective view of a light emitting device 10f of a fourth embodiment. FIG. 30B is an A-A cross-sectional view of FIG. 30A. FIG. 30C is a B-B cross-sectional view of FIG. 30A.

With respect to the first surface 15a, the third surface 30 of the light emitting device 10f of the embodiment is neither perpendicular nor parallel but is tilted.

In the cross section of FIG. 30C corresponding to the B-B cross section of FIG. 30A, the third surface 30 is tilted such that the exterior form of the resin layer 25 has an inverted trapezoidal configuration.

The p-side external terminal 23a of the p-side metal pillar 23, the n-side external terminal 24a of the n-side metal pillar 24, the side surface 21a of the p-side metal plate layer 21, and the side surface 22a of the n-side metal plate layer 22 exposed at the third surface 30 also are tilted along the tilt of the third surface 30.

Figure 31:
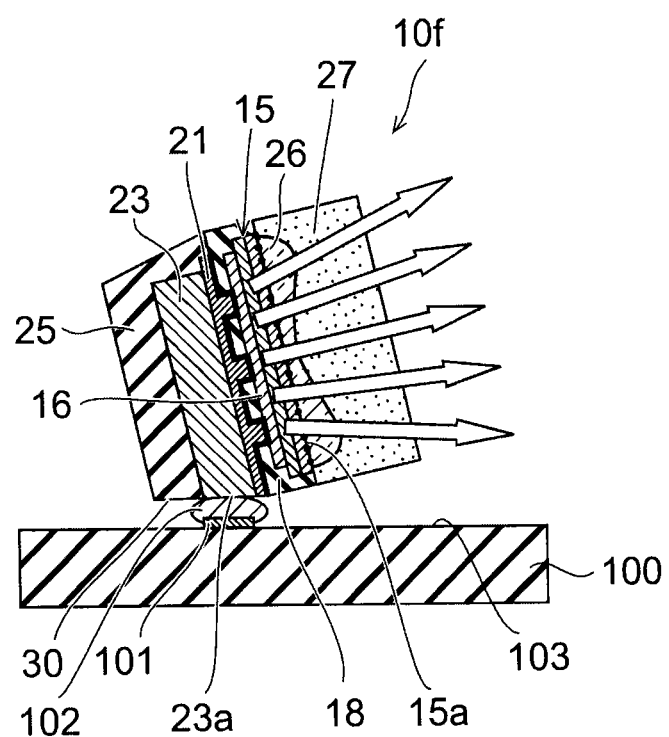
FIG. 31 is a schematic cross-sectional view of a light emitting module of the fourth embodiment.

FIG. 31 is a schematic cross-sectional view of a light emitting module having a configuration in which the light emitting device 10f of the embodiment is mounted on the mounting substrate 100.

The light emitting device 10f is mounted with an attitude in which the third surface 30 is oriented toward the mounting surface 103 of the mounting substrate 100. Each of the p-side external terminal 23a and the n-side external terminal 24a exposed at the third surface 30 is bonded with the solder 102, etc., to the pad 101 formed in the mounting surface 103.

In the embodiment as well, the p-side external terminal 23a and the n-side external terminal 24a are exposed at the third surface 30 having the plane orientation different from those of the first surface 15a and the second surface opposite to the first surface 15a. Therefore, a side-view type light emitting device 10f and light emitting module are obtained in which light is emitted in the lateral direction in the state in which the mounting surface is downward.

Further, because the third surface 30 is tilted with respect to the first surface 15a, the first surface 15a is oriented obliquely upward with an attitude in which the third surface 30 is oriented downward toward the mounting surface 103 side. In other words, the light is emitted obliquely upward in the case where the mounting surface 103 is a horizontal surface.

A method for manufacturing the light emitting device 10f of the embodiment will now be described with reference to FIG. 32A to FIG. 33B.

FIG. 32B corresponds to the A-A cross section of FIG. 32A; and FIG. 33B corresponds to the A-A cross section of FIG. 33A.

As illustrated in FIG. 32A, up to the process of forming the phosphor layer 27, the processes progress similarly to those of the first embodiment.

Then, the resin layer 25 is cut at the position of the dicing region d2 illustrated in FIG. 10B described above using a blade of which, for example, both width-direction side surfaces are formed with tapers. Thereby, as illustrated in FIG. 32B, a trench 55 is made under the dicing region d2. The trench 55 reaches the insulating layer 18 by piercing the resin layer 25. The trench 55 widens gradually away from the insulating layer 18 side.

In the embodiment as well, the p-side external terminal 23a and the n-side external terminal 24a jut into the dicing region d2. Accordingly, the p-side external terminal 23a and the n-side external terminal 24a are exposed at the trench 55.

Then, the insulating layer 18 and the phosphor layer 27 are cut on the trench 55 along the dicing region d2. Further, the phosphor layer 27, the insulating layer 18, and the resin layer 25 are cut along the dicing region d1 orthogonal to the dicing region d2. Thereby, as illustrated in FIGS. 33A and 33B, singulation into the multiple light emitting devices 10f is performed.

In the direction along the dicing region d1 of the resin layer 25 as well, the side surface of the resin layer 25 illustrated in FIG. 33A may be tilted by dicing using a blade of which both width-direction side surfaces are formed with tapers.

Fifth Embodiment

Figure 35A:
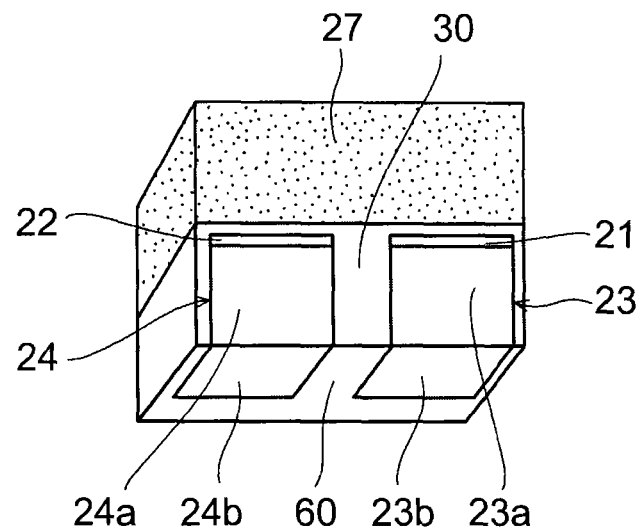
FIG. 35A is a schematic view of a light emitting device of a fifth embodiment.

FIG. 35A is a schematic perspective view of the light emitting device of a fifth embodiment.

Figure 35B:
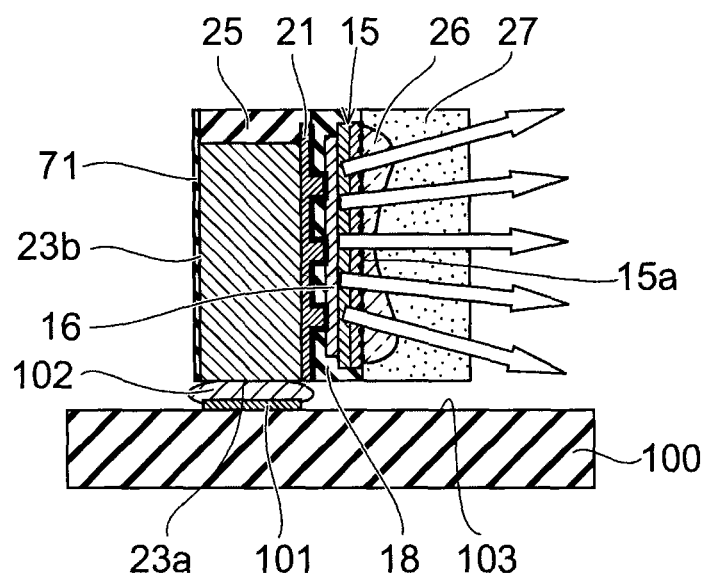
FIG. 35B is a schematic cross-sectional view of a light emitting module of the fifth embodiment.

FIG. 35B is a schematic cross-sectional view of a light emitting module having a configuration in which the light emitting device is mounted on the mounting substrate 100.

In the embodiment, a surface 23b and a surface 24b, which are different from the p-side external terminal 23a of the p-side metal pillar 23 and the n-side external terminal 24a of the n-side metal pillar 24, are exposed in the wafer state. The surface 23b and the surface 24b are exposed at the surface 60, which is different from the third surface 30 oriented toward the mounting surface 103 of the mounting substrate 100. The surface 60 is a surface on the side opposite to the light emitting surface.

In the wafer state, the light emitting surface corresponds to one surface of the wafer; and the surface 60 corresponds to one other surface. Accordingly, the surface 60 is exposed in the wafer state, which is different from the p-side external terminal 23a and the n-side external terminal 24a which are exposed after the dicing. By the surface 23b of a portion of the p-side metal pillar 23 and the surface 24b of a portion of the n-side metal pillar 24 being exposed at the surface 60, the surfaces 23b and 24b can be utilized as wafer level measurement terminals.

In other words, by bringing a measurement probe into contact with the surfaces 23b and 24b which have mutually different polarities and by supplying a current, the light emitting device can emit light and various inspections can be performed. The inspection is performed in the wafer level in which handling is easy.

After the inspection is completed, the surfaces 23b and 24b are covered with an insulating film (e.g., a resin) 71 illustrated in FIG. 35B. The formation of the insulating film 71 is performed collectively in the wafer state.

Then, as illustrated in FIG. 35B, the singulated light emitting device of the embodiment is mounted with an attitude in which the third surface 30 is oriented toward the mounting surface 103 of the mounting substrate 100. Each of the p-side external terminal 23a and the n-side external terminal 24a exposed at the third surface 30 is bonded with the solder 102, etc., to the pad 101 formed in the mounting surface 103.

When mounting, the surfaces 23b and 24b described above are covered with the insulating film 71 and are not exposed. Therefore, wetting of the solder up onto the surfaces 23b and 24b can be prevented. As a result, mounting defects such as tilting of the light emitting device and the light emitting surface rising to be oriented upward due to the wetting of the solder can be prevented.

Figure 34A:
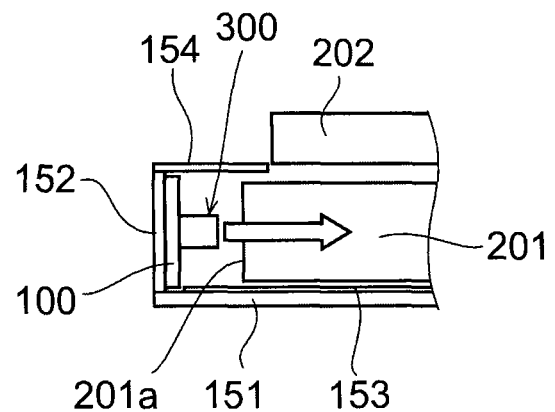
FIG. 34A is a schematic view of an illumination apparatus in which a light emitting module of a comparative example is used.
Figure 34B:
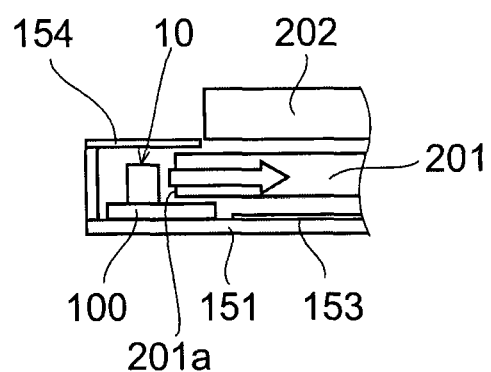
FIG. 34B is a schematic view of an illumination apparatus in which the light emitting module of the embodiment is used.

FIG. 34B is a schematic view of a specific example in which the light emitting module of the embodiment is used as, for example, a backlight of a liquid crystal display apparatus.

Here, a light emitting device 10 mounted on the mounting substrate 100 is illustrated as one typical light emitting device of the embodiments described above.

The mounting substrate 100 is provided on a frame 151. Because the light emitting device 10 is the side-view type, the light is emitted in the lateral direction as illustrated by the white arrow of the drawing in the state in which the mounting substrate 100 is downward.

The mounting substrate 100 is formed with, for example, a rectangular plate configuration extending into the page surface; and the multiple light emitting devices 10 are mounted in the longitudinal direction of the rectangular plate.

A light guide plate 201 is provided beside the light emitting module. The light guide plate 201 is transmissive to the light emitted from the light emitting device 10 and is made of, for example, a resin material. The light emitting surface of the light emitting device 10 faces a light incident surface 201a of the light guide plate 201.

A reflector 153 is provided below the light guide plate 201; and a liquid crystal panel 202 is provided above the light guide plate 201. Also, a reflector 154 is provided above the light emitting device 10. The reflectors 153 and 154 are reflective with respect to the light emitted from the light emitting device 10.

The light emitted in the lateral direction from the light emitting device 10 is incident on the light incident surface 201a of the light guide plate 201. The light incident on the light guide plate 201 from the light incident surface 201a spreads in the surface direction of the light guide plate 201 and is incident on the liquid crystal panel 202. The light from the light guide plate 201 that is emitted from the opposite side of the liquid crystal panel 202 is reflected by the reflector 153 and guided into the liquid crystal panel 202.

Here, FIG. 34A is a schematic view of a backlight in which a light emitting module of a comparative example is used as the light source.

A light emitting device 300 of the light emitting module of the comparative example is a so-called top-view type. In other words, the light is emitted upward from the mounting surface of the mounting substrate 100. Accordingly, the mounting substrate 100 is supported by a frame 152 provided to oppose the light incident surface 201a to cause the light emitting surface of the light emitting device 300 to oppose the light incident surface 201a of the light guide plate 201.

Therefore, the mounting substrate 100 having the rectangular plate configuration is disposed upright with an attitude in which the mounting surface is oriented toward the light incident surface 201a; and this may lead to an increase of not only the thickness of the light guide plate 201 but also the thickness of the entire backlight unit.

Conversely, in the embodiment illustrated in FIG. 34B, because it is unnecessary for the mounting substrate 100 to be upright in order to be oriented toward the light incident surface 201a of the light guide plate 201, not only the light guide plate 201 but also the entire backlight unit can be thinner.

The red phosphor layer, the yellow phosphor layer, the green phosphor layer, and the blue phosphor layer described below can be used as the phosphor layer described above.

The red phosphor layer can contain, for example, a nitride-based phosphor of $CaAlSiN_3$:Eu or a SiAlON-based phosphor.

In the case where a SiAlON-based phosphor is used, $$(M_{1-x}, R_x)_{a1}AlSi_{b1}O_{c1}N_{d1} \qquad \text{Compositional Formula (1)}$$

can be used (where M is at least one type of metal element excluding Si and Al, and it may be desirable for M to be at least one selected from Ca and Sr; R is a light emission center element, and it may be desirable for R to be Eu; and x, a1, b1, c1, and d1 satisfy the following relationships: x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7).

By using the SiAlON-based phosphor of Compositional Formula (1), the temperature characteristics of the wavelength conversion efficiency can be improved; and the efficiency in the high current density region can be increased further.

The yellow phosphor layer can contain, for example, a silicate-based phosphor of $(Sr, Ca, Ba)_2SiO_4$:Eu.

The green phosphor layer can contain, for example, a halophosphate-based phosphor of $(Ba, Ca, Mg)_{10}(PO_4)_6Cl_2$:Eu or a SiAlON-based phosphor.

In the case where a SiAlON-based phosphor is used, $$(M_{1-x}, R_x)_{a2}AlSi_{b2}O_{c2}N_{d2} \qquad \text{Compositional Formula (2)}$$

can be used (where M is at least one type of metal element excluding Si and Al, and it may be desirable for M to be at least one selected from Ca and Sr; R is a light emission center element, and it may be desirable for R to be Eu; and x, a2, b2, c2, and d2 satisfy the following relationships: x is larger than 0 and 1 or less, a2 is larger than 0.93 and less than 1.3, b2 is larger than 4.0 and less than 5.8, c2 is larger than 0.6 and less than 1, and d2 is larger than 6 and less than 11).

By using the SiAlON-based phosphor of Compositional Formula (2), the temperature characteristics of the wavelength conversion efficiency can be improved; and the efficiency in the high current density region can be increased further.

The blue phosphor layer can contain, for example, an oxide-based phosphor of $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device, comprising:
   a semiconductor layer including a first surface, a second surface opposite to the first surface, and a light emitting layer;
   a p-side electrode provided on the second surface in a region including the light emitting layer;
   an n-side electrode provided on the second surface in a region not including the light emitting layer;
   a first insulating layer provided on the second surface side, the first insulating layer having a first via communicating with the p-side electrode and a second via communicating with the n-side electrode;
   a p-side interconnect layer provided at least inside the first via, the p-side interconnect layer being electrically connected to the p-side electrode;
   an n-side interconnect layer provided apart from the p-side interconnect layer inside the second via and on an interconnect surface of the first insulating layer, the interconnect surface being opposite to the semiconductor layer, the n-side interconnect layer being electrically connected to the n-side electrode; and a second insulating layer provided at least between the p-side interconnect layer and the n-side interconnect layer, the p-side interconnect layer including a p-side external terminal exposed from the second insulating layer at a third surface having a plane orientation different from a plane orientation of the first surface and a plane orientation of the second surface, the n-side interconnect layer including an n-side external terminal exposed from the second insulating layer at the third surface.

2. The device of claim 1, wherein the p-side interconnect layer further includes a surface exposed from the second insulating layer other than the third surface, and the n-side interconnect layer further includes a surface exposed from the second insulating layer other than the third surface.

3. The device of claim 1, wherein the p-side interconnect layer includes a p-side metal plate layer and a p-side metal pillar, the p-side metal plate layer being provided at least inside the first via, the p-side metal pillar being provided on a surface of the p-side metal plate layer opposite to the interconnect surface and opposite to a contacting portion between the first via and the p-side metal plate layer, and the n-side interconnect layer includes an n-side metal plate layer and an n-side metal pillar, the n-side metal plate layer being provided inside the second via and on the interconnect surface, the n-side metal pillar being provided on a surface of the n-side metal plate layer opposite to the interconnect surface and opposite to a contacting portion between the second via and the n-side metal plate layer.

4. The device of claim 1, further comprising a transparent body provided on the first surface, the transparent body being transparent to light emitted from the light emitting layer.

5. The device of claim 1, wherein the third surface is perpendicular to the first surface.

6. The device of claim 1, wherein the third surface is tilted with respect to the first surface.

7. The device of claim 3, wherein a distance between the p-side external terminal and the n-side external terminal exposed at the third surface is greater than a distance between the p-side metal plate layer and the n-side metal plate layer on the interconnect surface.

8. The device of claim 3, wherein a planar size of the p-side metal plate layer is greater than a planar size of the p-side metal pillar.

9. The device of claim 3, wherein the first via is provided in a plurality, and the p-side metal plate layer is connected to the p-side electrode via the plurality of the first vias.

10. The device of claim 3, wherein the p-side metal pillar is thicker than the p-side metal plate layer.

11. The device of claim 4, wherein the transparent body includes a transparent resin and a phosphor dispersed in the transparent resin.

12. The device of claim 4, further comprising a reflective film provided on a side surface of the transparent body, the reflective film being reflective with respect to the light emitted from the light emitting layer.

13. The device of claim 12, wherein the reflective film is provided also on a side surface of the first insulating layer.

14. A light emitting module, comprising:

a mounting substrate including a pad on a mounting surface; and a light emitting device, the light emitting device including:

a semiconductor layer including a first surface, a second surface opposite to the first surface, and a light emitting layer;

a p-side electrode provided on the second surface in a region including the light emitting layer;

an n-side electrode provided on the second surface in a region not including the light emitting layer;

a first insulating layer provided on the second surface side, the first insulating layer having a first via communicating with the p-side electrode and a second via communicating with the n-side electrode;

a p-side interconnect layer provided at least inside the first via, the p-side interconnect layer being electrically connected to the p-side electrode;

an n-side interconnect layer provided apart from the p-side interconnect layer inside the second via and on an interconnect surface of the first insulating layer, the interconnect surface being opposite to the semiconductor layer, the n-side interconnect layer being electrically connected to the n-side electrode; and a second insulating layer provided at least between the p-side interconnect layer and the n-side interconnect layer, the p-side interconnect layer including a p-side external terminal exposed from the second insulating layer at a third surface having a plane orientation different from a plane orientation of the first surface and a plane orientation of the second surface, the n-side interconnect layer including an n-side external terminal exposed from the second insulating layer at the third surface, the light emitting device mounted on the mounting surface by bonding the p-side external terminal and the n-side external terminal to the pad, the first surface of the light emitting device being oriented in a lateral direction with an attitude having the third surface oriented downward.

15. A method for manufacturing a light emitting device, comprising:

forming a p-side interconnect layer at least inside a first via of a stacked body including a plurality of semiconductor layers, a p-side electrode, an n-side electrode, and a first insulating layer, the plurality of semiconductor layers being divided by a dicing region, each of the plurality of semiconductor layers including a first surface, a second surface opposite to the first surface, and a light emitting layer, the p-side electrode being provided on the second surface in a region including the light emitting layer, the n-side electrode being provided on the second surface in a region not including the light emitting layer, the first insulating layer being provided on the second surface side and having the first via communicating with the p-side electrode, a second via communicating with the n-side electrode, and an interconnect surface opposite to the semiconductor layer;

forming an n-side interconnect layer apart from the p-side interconnect layer on the interconnect surface and inside the second via;

forming a second insulating layer to cover the p-side interconnect layer and the n-side interconnect layer; and exposing one portion of the p-side interconnect layer and one portion of the n-side interconnect layer at a third surface having a plane orientation different from a plane orientation of the first surface and a plane orientation of the second surface by cutting a region including the second insulating layer, the one portion of the p-side interconnect layer, and the one portion of the n-side interconnect layer at the dicing region.

16. The method of claim 15, wherein the one portion of the p-side interconnect layer and the one portion of the n-side interconnect layer are formed to jut onto the dicing region extending in a direction along the third surface.

17. The method of claim 15,
the semiconductor layer being formed on a substrate,
the method further comprising:
   exposing the first surface by removing the substrate after the forming the second insulating layer; and
   forming a transparent body on the exposed first surface, the transparent body being transparent to light emitted from the light emitting layer.

18. The method of claim 16, wherein the jutting portion of the p-side interconnect layer and the n-side interconnect layer exists on both width-direction sides of the dicing region extending in the direction along the third surface.

19. The method of claim 17, further comprising forming a reflective film on a side surface of the transparent body, the reflective film being reflective with respect to the light emitted from the light emitting layer.

20. The method of claim 19, wherein the forming the reflective film includes:
   making a trench to divide the transparent body into a plurality by cutting the transparent body at a position on the dicing region prior to the cutting the second insulating layer;
   forming the reflective film on an inner wall of the trench and a top surface of the transparent body; and
   removing the reflective film formed on the top surface of the transparent body.

\* \* \* \* \*